(12) United States Patent
Lee et al.

(10) Patent No.: US 12,046,202 B2
(45) Date of Patent: Jul. 23, 2024

(54) DISPLAY DEVICE

(71) Applicant: Samsung Display Co., Ltd., Yongin-si (KR)

(72) Inventors: Sun Hee Lee, Hwaseong-si (KR); Hyang-A Park, Seoul (KR); Sunho Kim, Seongnam-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/143,376

(22) Filed: May 4, 2023

(65) Prior Publication Data

US 2023/0274702 A1 Aug. 31, 2023

Related U.S. Application Data

(63) Continuation of application No. 17/499,868, filed on Oct. 13, 2021, now Pat. No. 11,676,542.

(30) Foreign Application Priority Data

Jan. 5, 2021 (KR) .................. 10-2021-0000694

(51) Int. Cl.
*G09G 3/3266* (2016.01)
*G06F 3/041* (2006.01)
(Continued)

(52) U.S. Cl.
CPC ......... *G09G 3/3266* (2013.01); *G06F 3/0412* (2013.01); *G06F 3/04164* (2019.05);
(Continued)

(58) Field of Classification Search
CPC ...... G06F 3/041–048; G06F 2203/041–04114; G06F 2203/04112;
(Continued)

(56) References Cited

U.S. PATENT DOCUMENTS 9,755,882 B2 9/2017 Jain et al.
10,217,416 B2 2/2019 Lee et al.
(Continued)

FOREIGN PATENT DOCUMENTS

| JP | 6698915 | 5/2020 |
|---|---|---|
| KR | 10-2018-0079025 | 7/2018 |
| KR | 20220096882 | 7/2022 |

OTHER PUBLICATIONS

Non-Final Office Action mailed Aug. 3, 2022, in U.S. Appl. No. 17/499,868.
(Continued)

*Primary Examiner* — Sanjiv D. Patel
(74) *Attorney, Agent, or Firm* — Lewis Roca Rothgerber Christie LLP

(57) ABSTRACT

A display device includes: a display panel including an active area and a peripheral area adjacent to the active area and including a plurality of pixels overlapping the active area and a scan driving circuit overlapping a portion of each of the active area and the peripheral area. The scan driving circuit is configured to drive the plurality of pixels. A sensing sensor is disposed on the display panel and includes first sensing electrodes and second sensing electrodes overlapping the active area and insulated from each other and sensing lines connected to the first sensing electrodes and the second sensing electrodes. The plurality of pixels include: first pixels that do not overlap the scan driving circuit; and second pixels that overlap the scan driving circuit, wherein at least a portion of the sensing lines overlaps the scan driving circuit.

13 Claims, 19 Drawing Sheets

(51) Int. Cl.
*G06F 3/044* (2006.01)
*H10K 59/40* (2023.01)

(52) U.S. Cl.
CPC ........... *G06F 3/0446* (2019.05); *H10K 59/40* (2023.02); *G06F 2203/04111* (2013.01); *G06F 2203/04112* (2013.01); *G09G 2300/0452* (2013.01); *G09G 2320/0242* (2013.01)

(58) Field of Classification Search
CPC ............ G06F 3/0445; H10K 59/00–05; H10K 50/40; H10K 50/844; H10K 59/873
See application file for complete search history.

(56) References Cited

U.S. PATENT DOCUMENTS

| | | |
|---|---|---|
| 10,452,104 B2 | 10/2019 | Matsumoto |
| 10,541,281 B2 | 1/2020 | Han et al. |
| 11,435,848 B2 | 9/2022 | Park et al. |
| 2015/0205424 A1 | 7/2015 | Park |
| 2017/0010714 A1* | 1/2017 | Lee ........................ G06F 3/0448 |
| 2018/0197885 A1* | 7/2018 | Lee ..................... G06F 3/04164 |
| 2019/0179467 A1 | 6/2019 | Kim |
| 2020/0210024 A1* | 7/2020 | Hyun .................. G06F 3/04164 |
| 2020/0285337 A1 | 9/2020 | Lee |
| 2020/0357857 A1 | 11/2020 | Park et al. |
| 2022/0317809 A1* | 10/2022 | Zhang .................. G06F 3/0448 |

OTHER PUBLICATIONS

Final Office Action mailed Nov. 21, 2022, in U.S. Appl. No. 17/499,868.

Notice of Allowance mailed Feb. 1, 2023, in U.S. Appl. No. 17/499,868.

* cited by examiner

DISPLAY DEVICE

CROSS-REFERENCE TO RELATED APPLICATION

This application is a Continuation of U.S. patent application Ser. No. 17/499,868, filed Oct. 13, 2021, which claims priority from and the benefit of Korean Patent Application No. 10-2021-0000694, filed on Jan. 5, 2021, each of which is hereby incorporated by reference for all purposes as if fully set forth herein.

BACKGROUND

Field

Embodiments of the invention relate generally to a display device and more particularly, to a display device having an expanded light emitting area.

Discussion of the Background

Various electronic devices applied to multimedia devices, such as television sets, mobile phones, tablet computers, navigation units, or game units, have been developed.

In recent years, research has been carried out to reduce an area in which no image is displayed in the electronic devices in line with market needs. Also, additional research to expand an area through which an image is provided to a user in the electronic devices has been carried out.

The above information disclosed in this Background section is only for understanding of the background of the inventive concepts, and, therefore, it may contain information that does not constitute prior art.

SUMMARY

Display devices constructed according to the principles of the invention are capable of providing an expanded light emitting area with a reduced width of a bezel area.

Additional features of the inventive concepts will be set forth in the description which follows, and in part will be apparent from the description, or may be learned by practice of the inventive concepts.

According to an aspect of the invention, a display device includes: a display panel including an active area and a peripheral area adjacent to the active area and including a plurality of pixels overlapping the active area and a scan driving circuit overlapping a portion of each of the active area and the peripheral area, the scan driving circuit configured to drive the plurality of pixels; and a sensing sensor disposed on the display panel and including first sensing electrodes and second sensing electrodes overlapping the active area and insulated from each other and sensing lines connected to the first sensing electrodes and the second sensing electrodes, wherein the plurality of pixels include: first pixels that do not overlap the scan driving circuit; and second pixels that overlap the scan driving circuit, wherein at least a portion of the sensing lines overlaps the scan driving circuit.

The first sensing electrodes, the second sensing electrodes, and the sensing lines overlapping the scan driving circuit among the sensing lines may include mesh lines.

The sensing lines may include a first sensing line and a second sensing line adjacent to each other, wherein: the first sensing line may extend in a straight-line shape along one direction, and the second sensing line may extend in a zigzag shape along the one direction.

At least a portion of the first sensing electrodes and the second sensing electrodes may overlap the scan driving circuit.

The first pixels may include a first first-light emitting area configured to emit a first color light, a first second-light emitting area configured to emit a second color light, and a first third-light emitting area configured to a third color light, and the second pixels may include a second first-light emitting area configured to emit the first color light, a second second-light emitting area configured to emit the second color light, and a second third-light emitting area configured to emit the third color light.

The second first-light emitting area may have a size greater than a size of the first first-light emitting area, the second second-light emitting area may have a size greater than a size of the first second-light emitting area, and the second third-light emitting area may have a size greater than a size of the first third-light emitting area.

The sensing lines including the mesh lines may surround at least a portion of the second first-light emitting area, the second second-light emitting area, and the second third-light emitting area and may extend in a substantially same direction as a direction in which the first sensing electrodes extend.

The mesh lines of the sensing lines may have a first width, and the mesh lines of the first sensing electrodes and the second sensing electrodes may have a second width smaller than the first width.

The sensing lines having the first width may surround a first side of each of the second first-light emitting area, the second second-light emitting area, and the second third-light emitting area, and a second side opposite to the first side of each of the second first-light emitting area, the second second-light emitting area, and the second third-light emitting area may be exposed without being covered by the sensing lines.

The sensing lines may further include additional mesh lines surrounding the second side of each of the second first-light emitting area, the second second-light emitting area, and the second third-light emitting area and having a width substantially equal to the second width.

According to another aspect of the invention, a display device includes: a display panel including an active area and a peripheral area adjacent to the active area and including a plurality of pixels overlapping the active area and a scan driving circuit configured to drive the plurality of pixels; and a sensing sensor disposed on the display panel and including first sensing electrodes and second sensing electrodes overlapping the active area and insulated from each other and sensing lines connected to the first sensing electrodes and the second sensing electrodes, wherein: the scan driving circuit overlaps a portion of each of the active area and the peripheral area, the sensing lines disposed on the scan driving circuit overlapping the peripheral area among the sensing lines extend in a first direction, and the sensing lines disposed on the scan driving circuit overlapping the active area include mesh lines extending in a second direction which is diagonal to the first direction.

The plurality of pixels may include: first pixels that do not overlap the scan driving circuit; and second pixels that overlap the scan driving circuit.

The first pixels may include a first first-light emitting area configured to emit a first color light, a first second-light emitting area configured to emit a second color light, and a first third-light emitting area configured to a third color light, and the second pixels may include a second first-light emitting area configured to emit the first color light, a second second-light emitting area configured to emit the second color light, and a second third-light emitting area configured to emit the third color light.

The second first-light emitting area may have a size greater than a size of the first first-light emitting area, the second second-light emitting area may have a size greater than a size of the first second-light emitting area, and the second third-light emitting area may have a size greater than a size of the first third-light emitting area.

The sensing lines including the mesh lines may surround at least a portion of the second first-light emitting area, the second second-light emitting area, and the second third-light emitting area.

The mesh lines of the sensing lines may have a first width, and mesh lines of the first sensing electrodes and the second sensing electrodes may have a second width smaller than the first width.

The sensing lines including the mesh lines may surround a first side of each of the second first-light emitting area, the second second-light emitting area, and the second third-light emitting area, and a second side opposite to the first side of each of the second first-light emitting area, the second second-light emitting area, and the second third-light emitting area may be exposed without being covered by the sensing lines.

The sensing lines including the mesh lines may further include additional mesh lines surrounding the second side of each of the second first-light emitting area, the second second-light emitting area, and the second third-light emitting area and having a width substantially equal to the second width.

Each of the first sensing electrodes and the second sensing electrodes may include mesh lines extending in the second direction which is diagonal to the first direction, and at least a portion of the first sensing electrodes and the second sensing electrodes may overlap the scan driving circuit.

Among the first sensing electrodes and the second sensing electrodes, the mesh lines of the first sensing electrodes and the second sensing electrodes that do not overlap scan driving circuit may define a first opening, and the mesh lines of the first sensing electrodes and the second sensing electrodes that overlap the scan driving circuit may define a second opening greater than the first opening.

According to the above, the sensing lines, which are disposed in the active area and overlap the scan driving circuit, include the mesh lines having the same shape as that of the mesh lines included in the sensing patterns, and the sensing lines are disposed not to overlap the light emitting area of the pixels overlapping the scan driving circuit. Thus, even though the sensing lines are disposed in the active area, the light provided from the pixel disposed on the scan driving circuit may not be influenced by the sensing lines. Accordingly, a color purity of the display device may be improved.

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate illustrative embodiments of the invention, and together with the description serve to explain the inventive concepts.

DETAILED DESCRIPTION

Figure 1A:
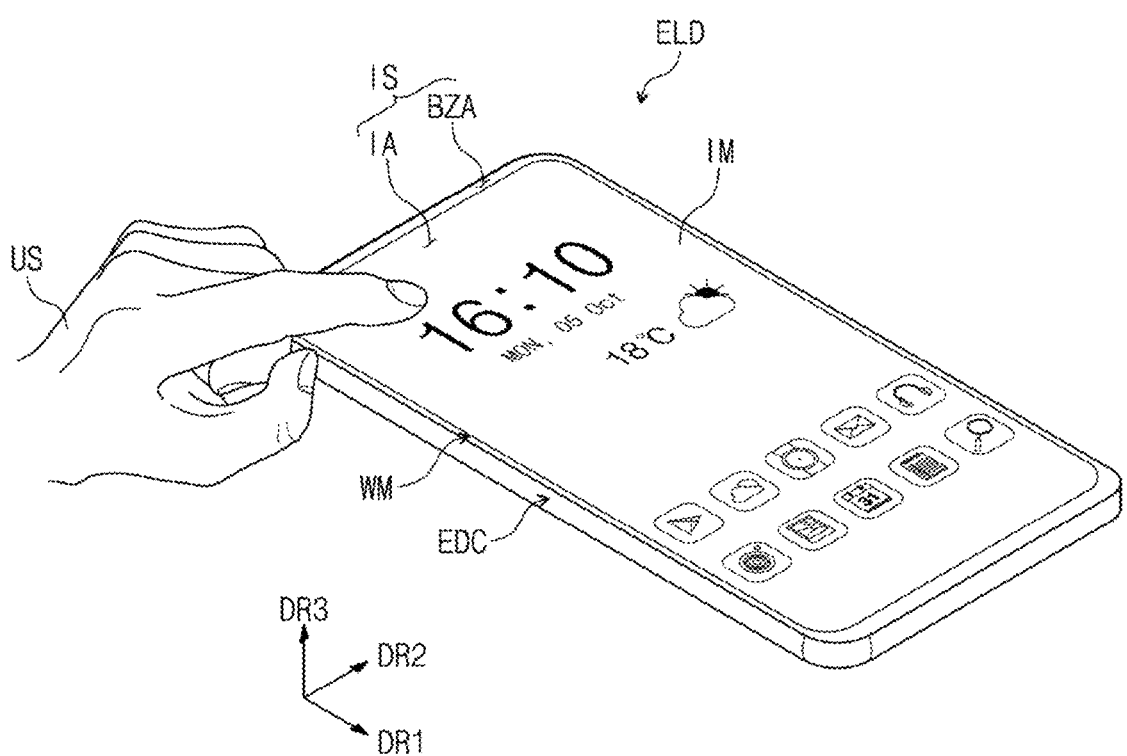
FIG. 1A is an assembled perspective view of an embodiment of a display device constructed according to the principles of the invention.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing illustrative features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the DR1-axis, the DR2-axis, and the DR3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 1B:
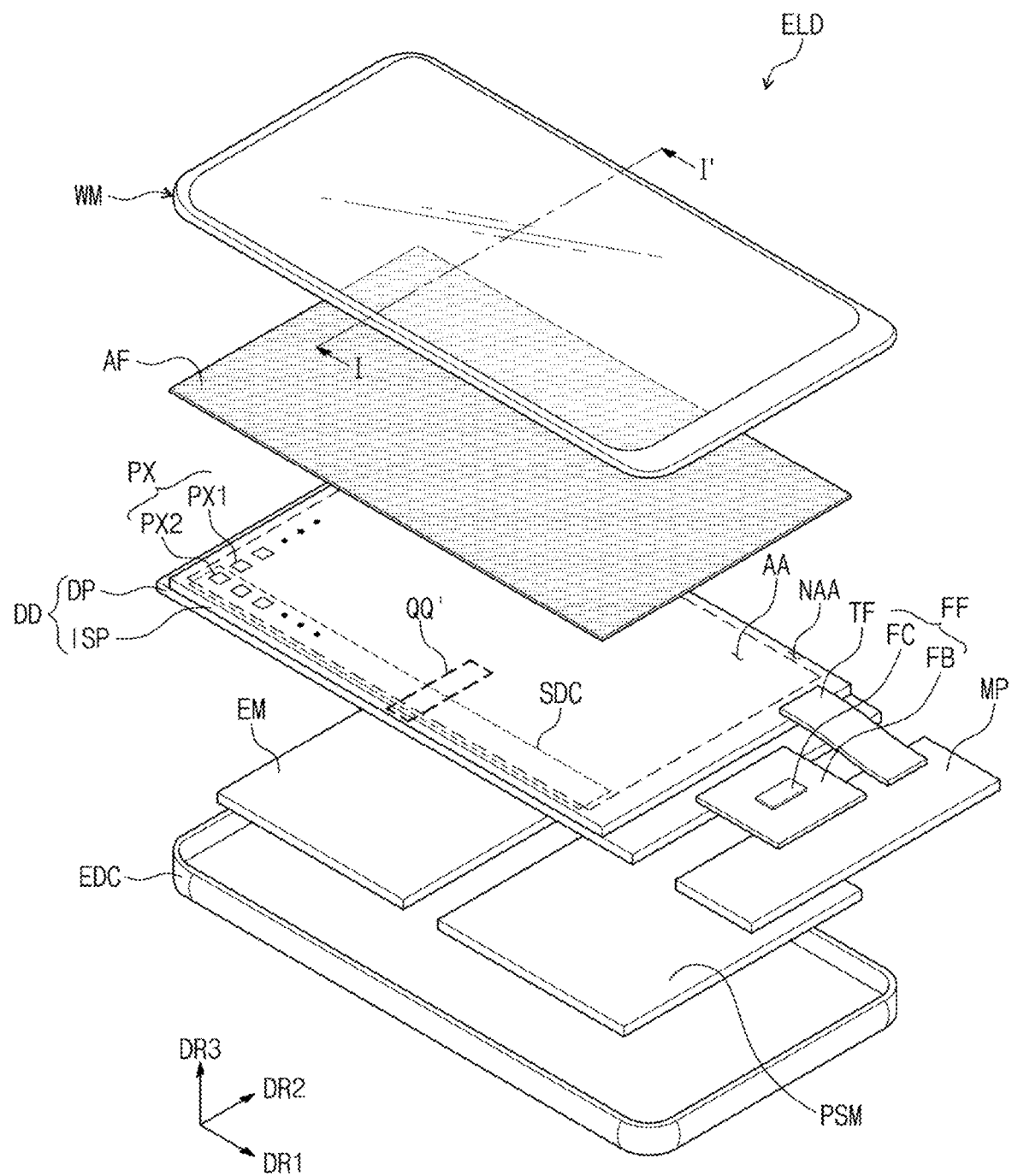
FIG. 1B is an exploded perspective view of the display device of FIG. 1A.
Figure 2A:
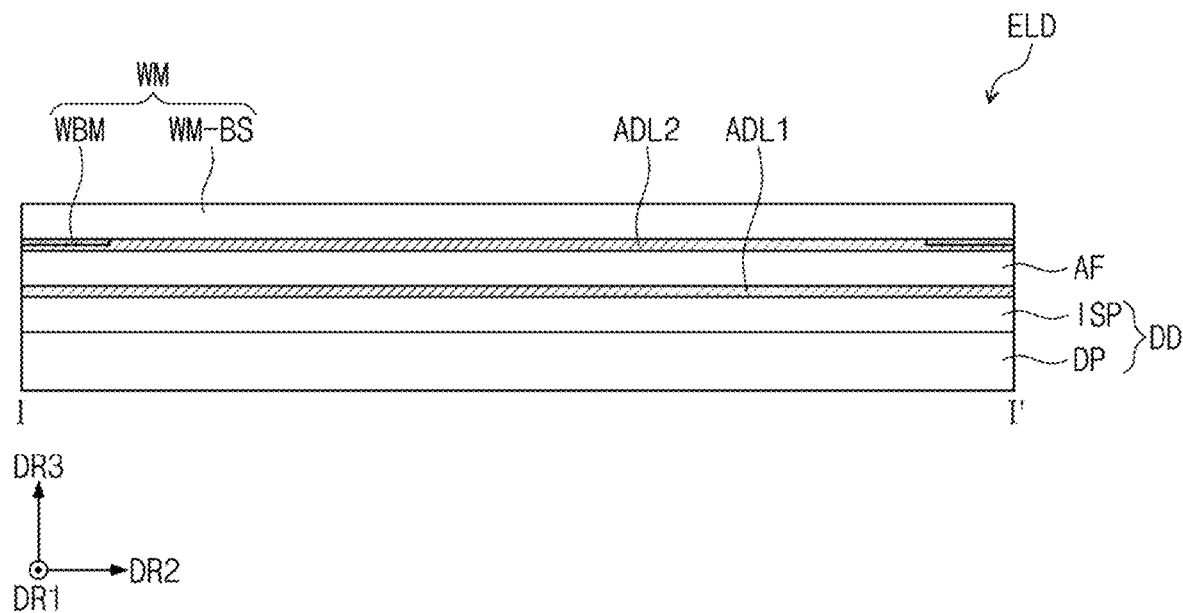
FIG. 2A is a cross-sectional view taken along a line I-I' of FIG. 1B.
Figure 2B:
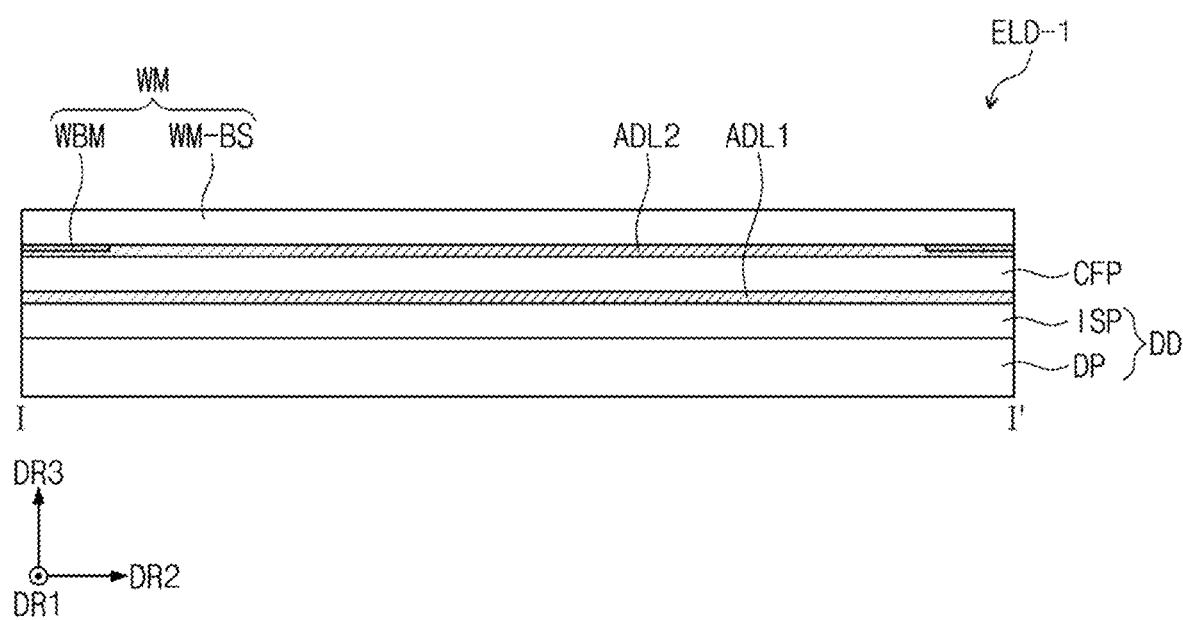
FIG. 2B is a cross-sectional view taken along the line I-I' of FIG. 1B illustrating another embodiment of the display device of FIG. 1B.
Figure 2C:
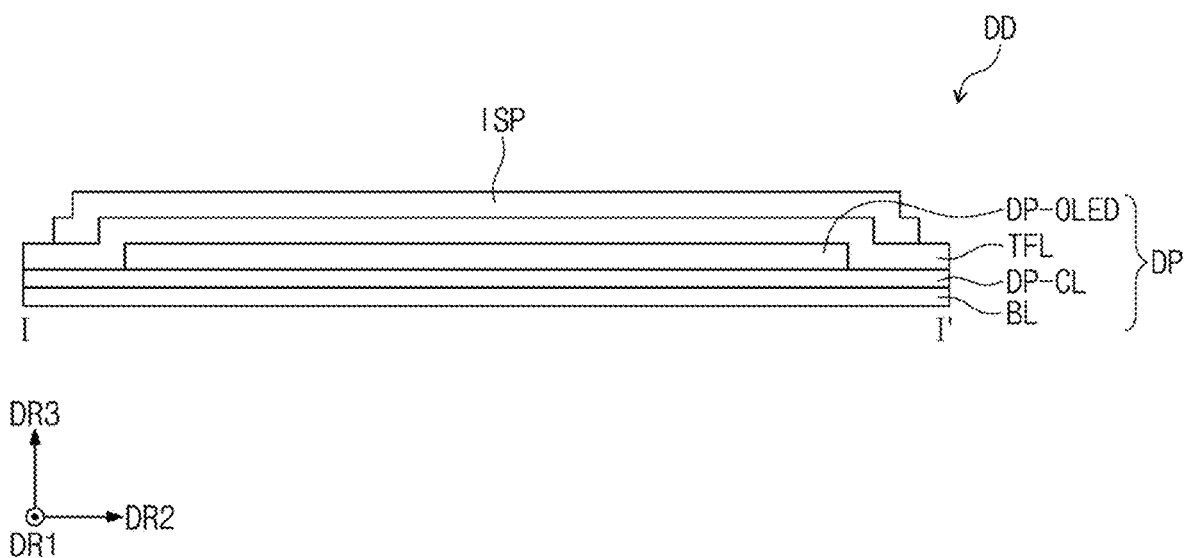
FIG. 2C is a cross-sectional view taken along the line I-I' of FIG. 1B illustrating another embodiment of the display device of FIG. 1B.
Figure 3A:
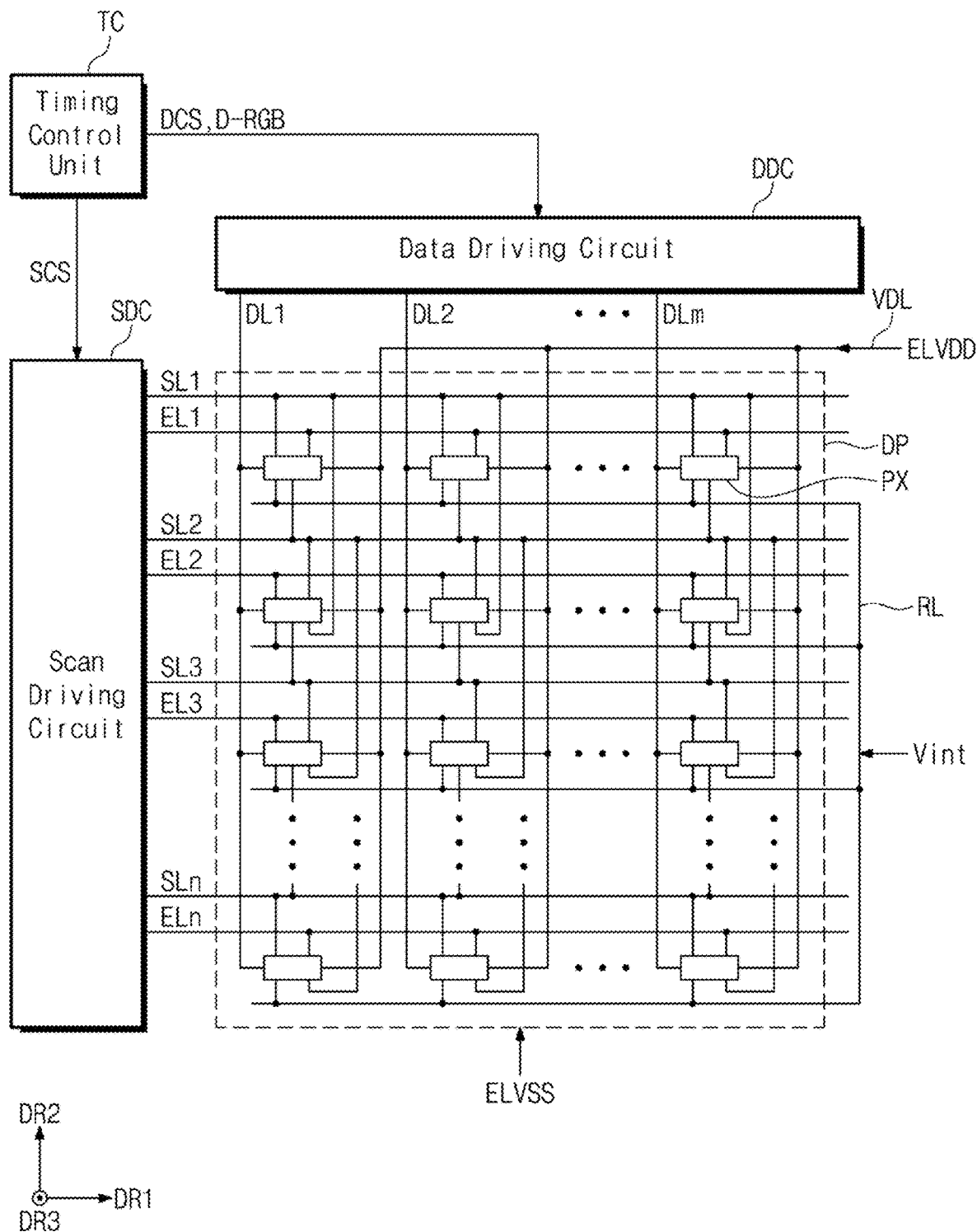
FIG. 3A is a block diagram of a display panel of the display device of FIG. 1B.
Figure 3B:
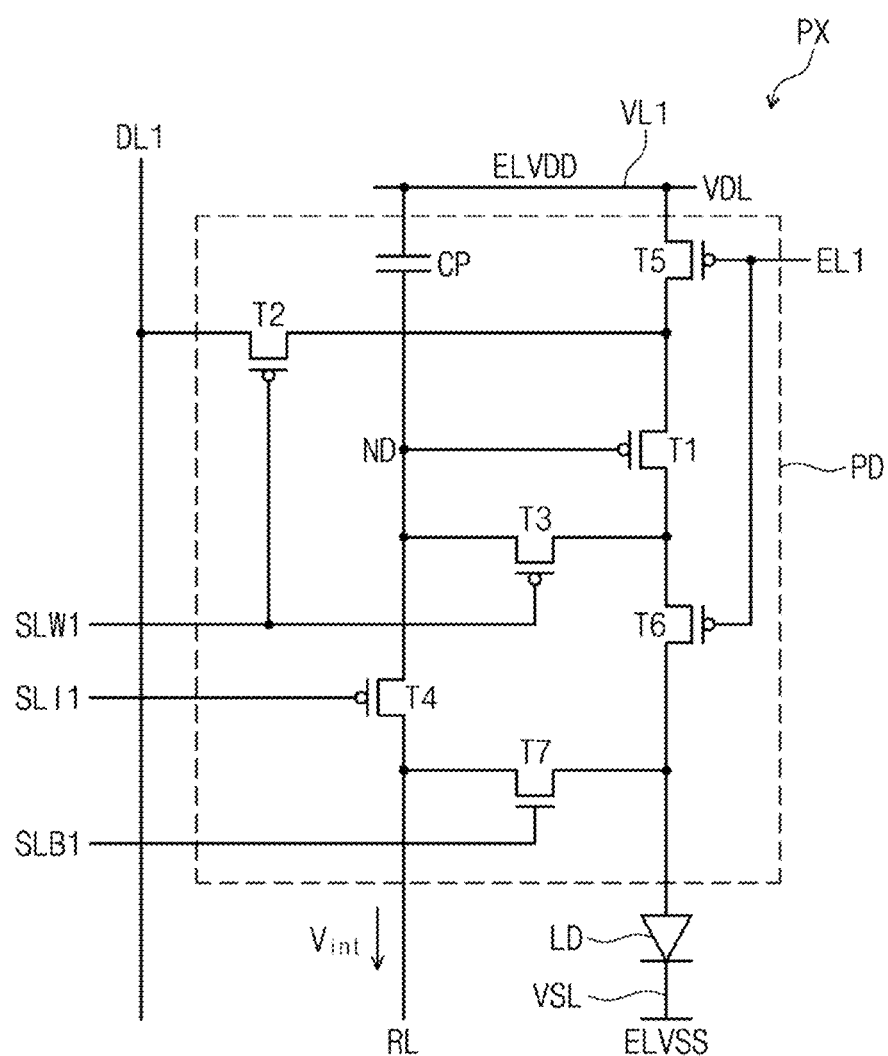
FIG. 3B is an equivalent circuit diagram of a representative pixel of the display panel of FIG. 1B.

FIG. 1A is an assembled perspective view of a display device ELD according to an embodiment. FIG. 1B is an exploded perspective view of the display device ELD according to an embodiment. FIG. 2A is a cross-sectional view taken along a line I-I' of FIG. 1B. FIG. 2B is a cross-sectional view of a display device ELD-1 in an area corresponding to FIG. 2A. FIG. 2C is a cross-sectional view of a display panel DP in an area corresponding to FIG. 2A. FIG. 3A is a block diagram of a display DP panel according to an embodiment. FIG. 3B is an equivalent circuit diagram of a pixel PX according to an embodiment.

Referring to FIGS. 1A and 1B, the display device ELD may be an apparatus, which is activated in response to an electrical signal. The display device ELD may include various embodiments. For example, the display device ELD may be applied to a smartphone, a tablet computer, a notebook computer, a computer, a smart television set, and the like.

The display device ELD may display an image IM through a display surface IS, which is substantially parallel to each of a first direction DR1 and a second direction DR2, toward a third direction DR3. The display surface IS through which the image IM is displayed may correspond to a front surface of the display device ELD. The image IM may include a video and a still image.

In an embodiment, front (e.g., upper) and rear (e.g., lower) surfaces of each member of the display device ELD may be defined with respect to a direction in which the image IM is displayed. The front and rear surfaces may be opposite to each other in the third direction DR3, and a normal line direction of each of the front and rear surfaces may be substantially parallel to the third direction DR3.

A separation distance between the front and rear surfaces may correspond to a thickness in the third direction DR3 of the display device ELD. For example, directions indicated by the first, second, and third directions DR1, DR2, and DR3 may be changed to other directions different from those defined in FIG. 1A.

The display device ELD may sense an external input applied thereto from the outside. The external input may include a variety of inputs provided from the outside of the display device ELD. The display device ELD according to an embodiment may sense the external input. The external input may be an input generated by a passive input device and may include an input applied by a body of a user US and an input that causes a variation in capacitance.

As an example, a hand of the user US that generates the external input is shown in FIG. 1A. However, the external input may be provided in a variety of ways. For example, the external input may include a proximity input (e.g., hovering) applied when approaching close to or adjacent to the display device ELD at a predetermined distance as well as a touch input by the user's body (e.g., the user's hand). In addition, the external inputs may be provided in the form of force, pressure, light, and the like. However, embodiments are not limited thereto or thereby.

The display surface IS of the display device ELD may include an image area IA (e.g., a display area) and a bezel area BZA (e.g., a non-display area). The image area IA may be an area through which the image IM is displayed. The user may view the image IM through the image area IA. In an embodiment, the image area IA may have a quadrangular shape with rounded vertices, however, this is merely one example. According to an embodiment, the image area IA may have a variety shapes, and embodiments are not limited thereto.

The bezel area BZA may be defined adjacent to the image area IA. The bezel area BZA may have a predetermined color. The bezel area BZA may surround the image area IA. Accordingly, the image area IA may have a shape substantially determined by the bezel area BZA. The color of the bezel area BZA may be a color provided by a light blocking pattern WBM of a window WM described later.

However, this is merely one example, and the bezel area BZA may be defined adjacent to only one side of the image area IA or may be omitted. According to an embodiment, the display device ELD may be implemented in various ways, and embodiments are not limited thereto.

As shown in FIG. 1B, the display device ELD may include a display module DD, an optical member AF, the window WM, an electronic module EM, a power module PSM, and a case EDC. The display module DD may generate an image and may sense an external input. The display module DD may include a display panel DP and a sensing sensor ISP. The display module DD may include an active area AA corresponding to the image area IA (e.g., a display area) and a peripheral area NAA corresponding to the bezel area BZA (e.g., a non-display area) of the display device ELD.

According to an embodiment, the active area AA may be an area in which pixels PX are arranged to display the image IM.

According to an embodiment, the display panel DP should not be particularly limited thereto. The display panel DP may be a light emitting type display panel, for example, an organic light emitting display panel or a quantum dot light emitting display panel. The sensing sensor ISP will be described in detail later.

The display module DD may include a main circuit board MP and flexible circuit boards FF and TF. The main circuit board MP may be connected to a first flexible circuit board FF to be electrically connected to the display panel DP, and the main circuit board MP may be electrically connected to a second flexible circuit board TF to be electrically connected to the sensing sensor ISP. The main circuit board MP may include a driving device. The driving device may include a timing controller TC (refer to FIG. 3A). The timing controller TC may receive input image signals and may convert the input image signals to image data suitable for an operation of the pixels. In addition, the timing controller TC may receive a variety of control signals, e.g., a vertical synchronization signal, a horizontal synchronization signal, a main clock signal, and a data enable signal and may output signals respectively corresponding to the signals. In addition, the driving device may include a controller to control the sensing sensor ISP. However, embodiments are not limited thereto.

The first flexible circuit board FF may be connected to one side of the display panel DP to electrically connect the display panel DP to the main circuit board MP. The first flexible circuit board FF may include a base film FB and a driving chip FC.

The base film FB may have flexibility and may include a plurality of circuit lines. Accordingly, the base film FB may be provided in various forms according to the purpose and shape of the display panel DP.

The driving chip FC may be mounted on the base film FB in a chip-on-film (COF). The driving chip FC may include driving elements, e.g., a data driving circuit DDC (refer to FIG. 3A), to drive the pixel. According to an embodiment, one first flexible circuit board FF is shown, however, embodiments are not limited thereto or thereby. According to an embodiment, the first flexible circuit board FF may be provided in plural and may be connected to the display panel DP.

The second flexible circuit board TF may be connected to one side of the sensing sensor ISP to electrically connect the sensing sensor ISP and the main circuit board MP. The second flexible circuit board TF may have flexibility and may include a plurality of circuit lines. The second flexible circuit board TF may transmit input sensing signals provided from the main circuit board MP to the sensing sensor ISP.

The optical member AF may be disposed between the display module DD and the window WM. The optical member AF may decrease a reflectance of an external light. The optical member AF may include a polarizer and a retarder. The polarizer and the retarder may be a stretch or coating type. A coating type optical film may have an optical axis defined along a direction in which a functional film extends. The coating type optical film may include liquid crystal molecules aligned on a base film.

According to an embodiment, the optical member AF may be omitted. In this case, a color filter and a black matrix may be included in the display module DD instead of the optical member AF.

The window WM may define an exterior of the display device ELD. The window WM may include a base substrate and may further include functional layers, such as an anti-reflective layer, an anti-fingerprint layer, and the like.

For example, the display module DD may further include at least one adhesive layer. The adhesive layer may attach adjacent components of the display module DD to each other. The adhesive layer may be a transparent adhesive layer, such as a pressure sensitive adhesive (PSA) film, an optically clear adhesive (OCA) film, an optically clear resin (OCR), or the like.

The electronic module EM may include a main controller. The electronic module EM may include a wireless communication module, an image input module, an audio input module, an audio output module, a memory, an external interface module, and the like. The modules may be mounted on the circuit board or may be electrically connected to each other via a flexible circuit board. The electronic module EM may be electrically connected to the power module PSM.

The main controller may control an overall operation of the display device ELD. For example, the main controller may activate or deactivate the display module DD according to a user's input. The main controller may control operations of the display module DD, the wireless communication module, the image input module, the audio input module, the audio output module, and the like. The main controller may include at least one microprocessor.

The case EDC may be coupled with the window WM. The case EDC may absorb impacts applied thereto from the outside and may prevent a foreign substance and moisture from entering the display module DD to protect components accommodated in the case EDC. For example, according to an embodiment, the case EDC may be provided in a form in which a plurality of accommodation members is combined.

For example, the display device ELD may be inwardly folded (e.g., in-folding) with respect to a folding axis extending in the first direction DR1 or the second direction DR2 such that different portions of the display surface IS face each other. For example, the display device ELD may be outwardly folded (e.g., out-folding) with respect to the folding axis such that different portions of the case EDC face each other. However, embodiments are not limited thereto.

Referring to FIG. 2A, the sensing sensor ISP may be disposed directly on the display panel DP. According to an embodiment, the sensing sensor ISP may be formed on the display panel DP through successive processes. For example, when the sensing sensor ISP is disposed directly on the display panel DP, an adhesive layer may not be disposed between the sensing sensor ISP and the display panel DP.

The window WM may include a base layer WM-BS and the light blocking pattern WBM. The bezel area BZA of the display device ELD may be defined by the light blocking pattern WBM formed on one surface of the base layer WM-BS. The light blocking pattern WBM may be a color organic layer and may be formed on the one surface of the base layer WM-BS by a coating process.

A first adhesive layer ADL1 may be disposed between the optical member AF and the display module DD to attach the optical member AF to the display module DD. A second adhesive layer ADL2 may be disposed between the optical member AF and the window WM to attach the optical member AF to the window WM. Each of the adhesive layers ADL1 and ADL2 may be a transparent adhesive layer, such as a pressure sensitive adhesive (PSA) film, an optically clear adhesive (OCA) film, or an optically clear resin (OCR).

Referring to FIG. 2B, the display device ELD-1 may include a color filter CFP instead of the optical member AF included in the display device ELD of FIG. 2A.

The color filter CFP may be disposed between the display module DD and the window WM. The color filter CFP may be disposed to overlap each of light emitting areas described later and may transmit lights provided thereto from the light emitting areas. The color filter CFP may include at least one color filter among a blue color filter for selectively transmitting a blue light, a green color filter for selectively transmitting a green light, and a red color filter for selectively transmitting a red light. The color filter CFP may include a polymer photosensitive resin and a pigment or a dye. According to an embodiment, the color filter CFP may further include a division pattern to prevent colors of different lights emitted from the light emitting areas from being mixed.

Referring to FIG. 2C, the display panel DP may include a base layer BL, a circuit element layer DP-CL, a display element layer DP-OLED, and an upper insulating layer TFL. The circuit element layer DP-CL, the display element layer DP-OLED, and the upper insulating layer TFL may be disposed on the base layer BL.

The base layer BL may include at least one plastic film. The base layer BL may include a plastic substrate, a glass substrate, a metal substrate, or an organic/inorganic composite substrate. According to an embodiment, the base layer BL may be a thin film glass substrate having a thickness of tens to hundreds micrometers. However, embodiments are not limited thereto. The base layer BL may have a multi-layer structure of a polyimide film/at least one inorganic layer/a polyimide film.

The circuit element layer DP-CL may include at least one insulating layer and a circuit element. The insulating layer may include at least one inorganic layer and at least one organic layer. The circuit element may include signal lines and a pixel driving circuit. This will be described in detail later.

The display element layer DP-OLED may include at least one light emitting element. The display element layer DP-OLED may further include an organic layer such as a pixel definition layer. The light emitting areas described later may be defined by a size of an opening defined through the pixel definition layer.

The upper insulating layer TFL may include a protective layer to protect the light emitting element included in the display element layer DP-OLED. The upper insulating layer TFL may include a thin film encapsulation layer that includes at least inorganic layer/organic layer/inorganic layer. The thin film encapsulation layer may be disposed on the protective layer.

Referring to FIG. 3A, the display module DD may include the timing controller TC, a scan driving circuit SDC, and the data driving circuit DDC, which are connected to the display panel DP.

The timing controller TC may receive input image signals and may convert a data format of the input image signals into a data format appropriate to (or compatible to) an interface between the timing controller TC and the scan driving circuit SDC to generate image data D-RGB. The timing controller TC may output the image data D-RGB and various control signals DCS and SCS.

The scan driving circuit SDC may receive a scan control signal SCS from the timing controller TC. The scan control signal SCS may include a vertical start signal for starting an operation of the scan driving circuit SDC, a clock signal for determining an output timing of signals, and the like.

FIG. 3A shows a structure in which scan signals and light emitting control signals are output from one scan driving circuit SDC. However, embodiments are not be limited thereto or thereby. According to an embodiment, scan driving circuits may output the scan signals after dividing the scan signals into plural groups and may output the light emitting control signals after dividing the light emitting control signals into plural groups. In addition, according to an embodiment, a driving circuit for generating and outputting the scan signals and a driving circuit for generating and outputting the light emitting control signals may be provided separately from each other.

Referring to FIG. 1B, the scan driving circuit SDC may overlap a portion of the active area AA and a portion of the peripheral area NAA. For example, the scan driving circuit SDC may be formed on the circuit element layer DP-CL described with reference to FIG. 2C and may overlap the portion of the active area AA in which the pixels PX are arranged. According to an embodiment, as the pixels PX are arranged in the area overlapping the scan driving circuit SDC, an area required to dispose the scan driving circuit SDC may be reduced in the peripheral area NAA.

The data driving circuit DDC may receive the data control signal DCS and the image data D-RGB from the timing controller TC. The data driving circuit DDC may convert the image data D-RGB to data signals and may output the data signals to data lines DL1 to DLm. The data signals may be analog voltages corresponding to grayscale values of the image data D-RGB.

The display panel DP may include scan lines SL1 to SLn, light emitting lines EL1 to ELn, the data lines DL1 to DLm, and the pixels PX. The scan lines SL1 to SLn may extend in the first direction DR1 and may be arranged in the second direction DR2 intersecting the first direction DR1.

Each of the light emitting lines EL1 to ELn may be arranged to be substantially parallel to a corresponding scan line among the scan lines SL1 to SLn. The data lines DL1 to DLm may be insulated from the scan lines SL1 to SLn while intersecting the scan lines SL1 to SLn.

Each of the pixels PX may be connected to a corresponding scan line among the scan lines SL1 to SLn, a corresponding light emitting line among the light emitting lines EL1 to ELn, and corresponding data lines among the data lines DL1 to DLm.

Each of the pixels PX may receive a first power ELVDD and a second power ELVSS having a level lower than that of the first power ELVDD. Each of the pixels PX may be connected to a driving power line VDL to which the first power ELVDD is applied. Each of the pixels PX may be connected to an initialization voltage line RL to which an initialization voltage Vint is applied.

Each of the pixels PX may be electrically connected to three scan lines. As shown in FIG. 3A, the pixels arranged in a second pixel row may be connected to first to third scan lines SL1 to SL3.

For example, the display panel DP may further include a plurality of dummy scan lines. The display panel DP may further include a dummy scan line connected to the pixels PX arranged in a first pixel row and a dummy scan line connected to the pixels PX arranged in an n-th pixel row.

In addition, pixels (hereinafter, pixels of a pixel column) connected to one data line among the data lines DL1 to DLm may be connected to each other. Two pixels adjacent to each other among the pixels of the pixel column may be electrically connected to each other, however, this is merely one example. A connection relation between the pixels PX may be designed in various ways. However, embodiments are not limited thereto.

In an embodiment, at least one of the scan driving circuit SDC and the data driving circuit DDC may include thin film transistors formed through the same processes as the pixel driving circuit. As an example, both the scan driving circuit SDC and the data driving circuit DDC may be mounted on the display panel DP. As another way, one of the scan driving circuit SDC and the data driving circuit DDC may be disposed on the display panel DP, and the other of the scan driving circuit SDC and the data driving circuit DDC may be provided as the circuit board described earlier and may be connected to the display panel DP.

Referring to FIG. 3B, the pixel PX may include a plurality of transistors T1, T2, T3, T4, T5, T6, and T7, a capacitor CP, and a light emitting element LD. First, second, and third scan lines SLW1, SLI1, and SLB1 may correspond to the scan lines SL1, SL2, and SL3 shown in FIG. 3A, respectively. The transistors T1 to T7 and the capacitor CP may control an amount of current flowing through the light emitting element LD in response to the data signals and the scan signals.

Each of the transistors T1 to T7 may include an input electrode (or a source electrode), an output electrode (or a drain electrode), and a control electrode (or a gate electrode). An input electrode of a first transistor T1 may be connected to the driving power line VDL via a fifth transistor T5. The driving power line VDL may be a line to which the first power ELVDD is applied. An output electrode of the first transistor T1 may be connected to an anode electrode of the light emitting element LD via a sixth transistor T6.

The first transistor T1 may control the amount of current flowing through the light emitting element LD in response to a voltage applied to a control electrode of the first transistor T1.

A second transistor T2 may be connected between the data line DL1 and the input electrode of the first transistor T1. A control electrode of the second transistor T2 may be connected to the first scan line SLW1. When a second scan signal is applied to the first scan line SLW1, the second transistor T2 may be turned on and may electrically connect the data line DL1 to the input electrode of the first transistor T1.

A third transistor T3 may be connected between the output electrode of the first transistor T1 and the control electrode of the first transistor T1. A control electrode of the third transistor T3 may be connected to the first scan line SLW1. When the second scan signal is applied to the first scan line SLW1, the third transistor T3 may be turned on and may electrically connect the output electrode of the first transistor T1 to the control electrode of the first transistor T1. Accordingly, when the third transistor T3 is turned on, the first transistor T1 may be connected in a diode configuration.

A fourth transistor T4 may be connected between a node ND and the initialization voltage line RL. A control electrode of the fourth transistor T4 may connected to the second scan line SLI1. The node ND may be a node at which the fourth transistor T4 is connected to the control electrode of the first transistor T1. When a first scan signal is applied to the second scan line SLI1, the fourth transistor T4 may be turned on and may provide an initialization voltage Vint to the node ND. The first scan signal may be a signal generated prior to the second scan signal. For example, the first scan signal may be substantially the same as a signal applied to the first scan line SLW1 of the pixels arranged in a previous pixel row.

The fifth transistor T5 may be connected between the driving power line VDL and the input electrode of the first transistor T1. The sixth transistor T6 may be connected between the output electrode of the first transistor T1 and the anode electrode of the light emitting element LD. A control electrode of the fifth transistor T5 and a control electrode of the sixth transistor T6 may be connected to a first light emitting control line ELl A seventh transistor T7 may be connected between the initialization voltage line RL and the anode electrode of the light emitting element LD. A control electrode of the seventh transistor T7 may be connected to the third scan line SLB1. When a third scan signal is applied to the third scan line SLB1, the seventh transistor T7 may be turned on and may provide the initialization voltage Vint to the anode electrode of the light emitting element LD. For example, the third scan signal may be substantially the same as a signal applied to the first scan line SLI1 of the pixels arranged in a next pixel row.

In FIG. 3B, the control electrode of the seventh transistor T7 is connected to the third scan line SLB1, however, embodiments are not limited thereto or thereby. According to an embodiment, the control electrode of the seventh transistor T7 may be connected to the second scan line SLW1.

FIG. 3B illustrates a PMOS transistor as a reference of the first to seventh transistors T1 to T7, however, embodiments are not limited thereto or thereby. According to an embodiment, some or all of the first to seventh transistors T1 to T7 may be implemented by an NMOS transistor.

The capacitor CP may be disposed between the driving power line VDL and the node ND. The driving power line VDL may provide the first power ELVDD to the pixels. The capacitor CP may be charged with a voltage corresponding to the data signal. When the fifth and sixth transistors T5 and T6 are turned on, the amount of the current flowing through the first transistor T1 may be determined according to the voltage charged in the capacitor CP.

The light emitting element LD may be electrically connected to the sixth transistor T6 and a power line VSL. The anode electrode of the light emitting element LD may be connected to the sixth transistor T6, and a cathode electrode of the light emitting element LD may be connected to the power line VSL. The power line VSL may receive the second power ELVSS. The light emitting element LD may emit the light with the voltage corresponding to a difference between the signal provided via the sixth transistor T6 and the second power ELVSS.

Referring to FIG. 1B again, the pixels PX may include first pixels PX1 and second pixels PX2. The first pixels PX1 and the second pixels PX2 may be arranged in the active area AA. Hereinafter, the first pixels PX1 may be defined as pixels that do not overlap the scan driving circuit SDC of the active area AA among the pixels PX, and the second pixels PX2 may be defined as pixels that overlap the scan driving circuit SDC of the active area AA among the pixels PX.

Figure 4A:
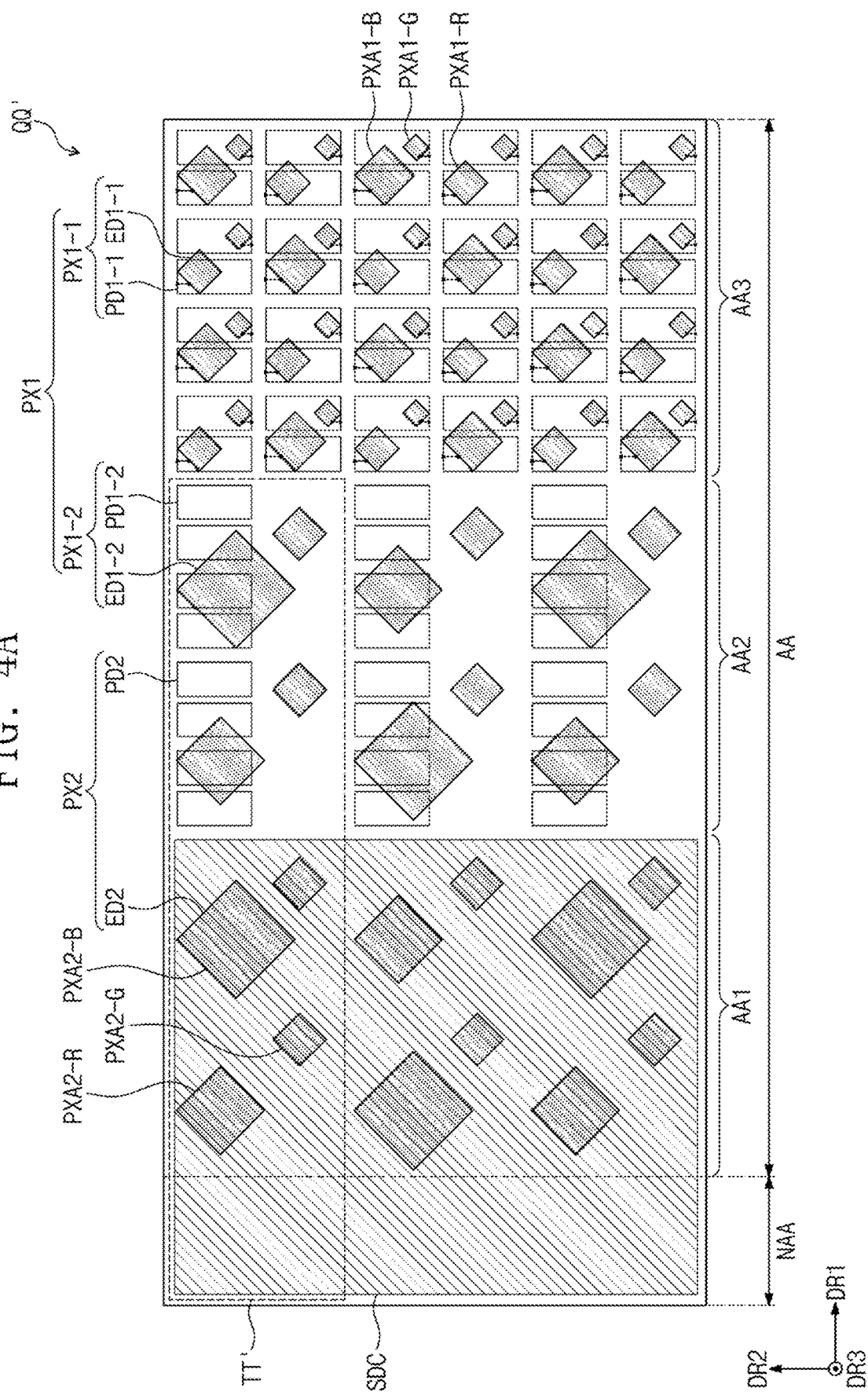
FIG. 4A is an enlarged plan view of an area QQ' of FIG. 1B illustrating an embodiment of the display panel of FIG. 1B.
Figure 4B:
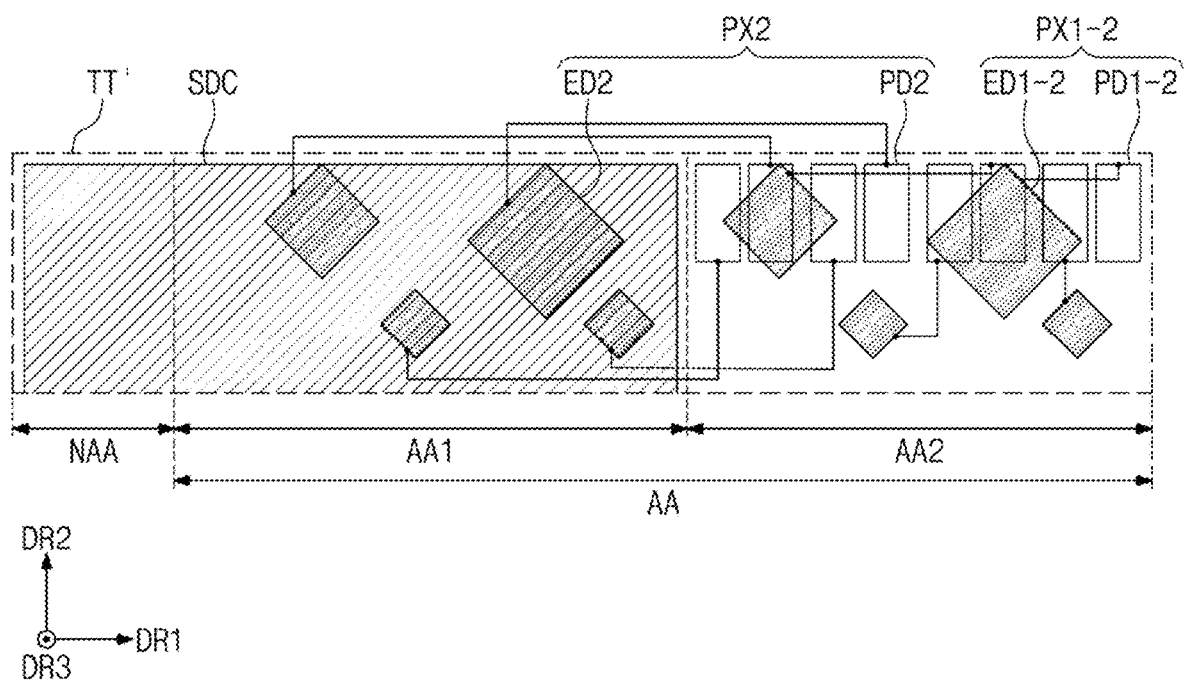
FIG. 4B is an enlarged plan view of an area TT' of FIG. 4A.
Figure 5A:
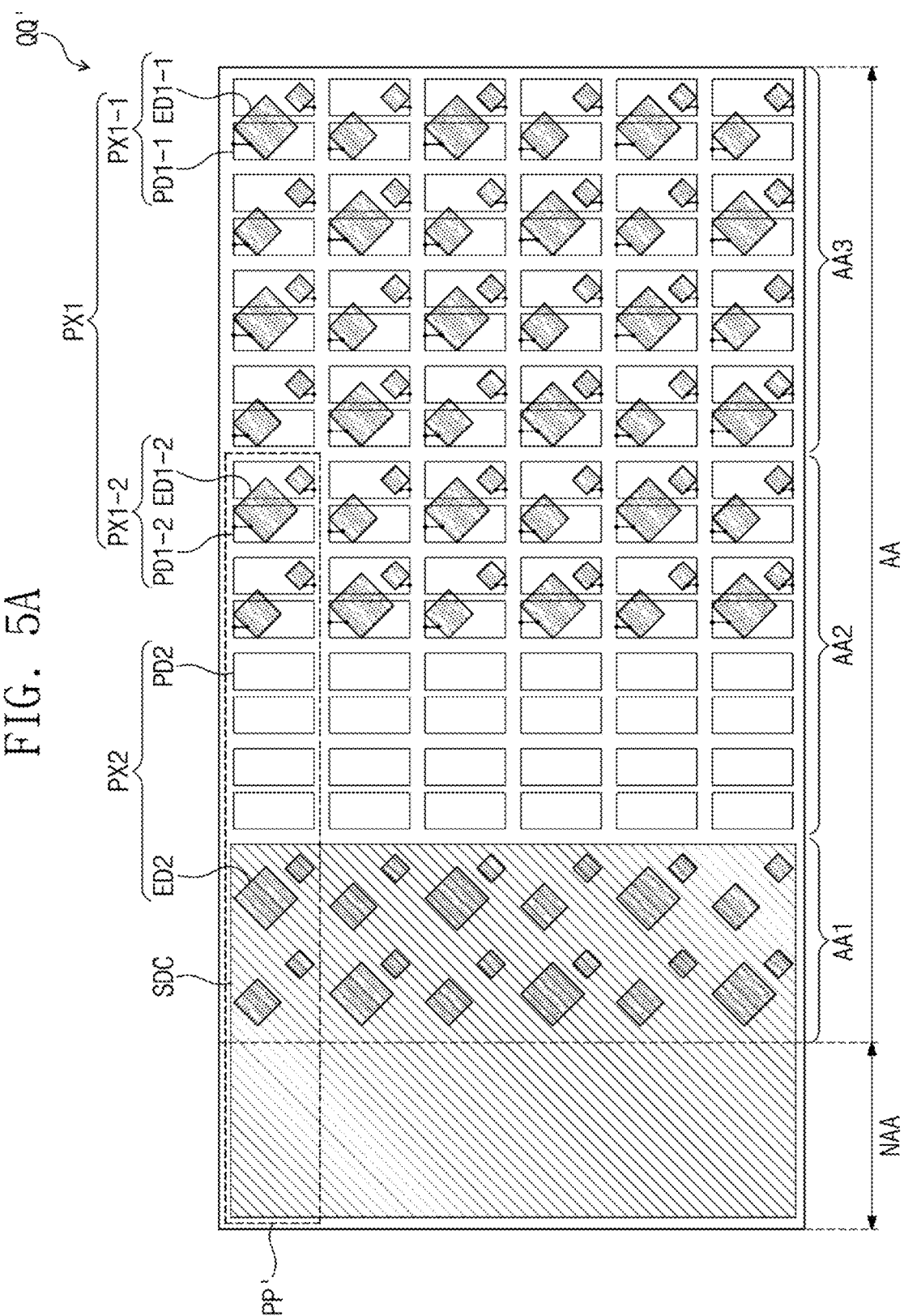
FIG. 5A is an enlarged plan view of the area QQ' of FIG. 1B illustrating another embodiment of the display panel of FIG. 1B.
Figure 5B:
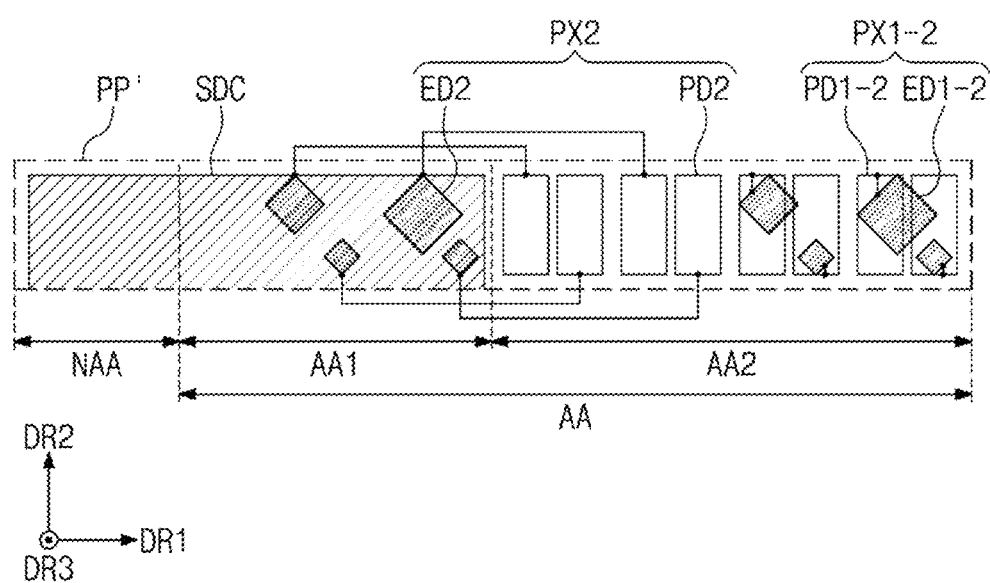
FIG. 5B is an enlarged plan view of an area PP' of FIG. 5A.

FIG. 4A is an enlarged plan view showing an area QQ' of the display panel DP shown in FIG. 1B. FIG. 4B is an enlarged plan view of an area TT' of FIG. 4A. FIG. 5A is a plan view of a display panel DP in an area corresponding to FIG. 4A. FIG. 5B is an enlarged plan view of an area PP' of FIG. 5A.

Referring to FIGS. 4A and 4B, the display panel DP may include the active area AA (e.g., a display area) in which the pixels PX1 and PX2 are arranged and the peripheral area NAA (e.g., a non-display area) defined adjacent to the active area AA.

The first pixels PX1 may include first first-pixels PX1-1 and first second-pixels PX1-2 according to an arrangement of the active area AA.

The active area AA may include a first active area AA1 (e.g., a first display area), a second active area AA2 (e.g., a second display area), and a third active area AA3 (e.g., a third display area), which are sequentially arranged in the first direction DR1.

The first active area AA1 may correspond to a portion of the active area AA, which overlaps the scan driving circuit SDC.

Among a second light emitting element ED2 and a second pixel driving circuit PD2 included in the each of the second pixels PX2, only the second light emitting element ED2 may be disposed in the first active area AA1. As the second pixel driving circuit PD2 included in the second pixels PX2 may be formed in the circuit element layer DP-CL with the scan driving circuit SDC, the second pixel driving circuit PD2 and the second light emitting element ED2 connected to the second pixel driving circuit PD2 may be disposed in different active areas.

The second active area AA2 may be disposed between the third active area AA3 and the first active area AA1. The second active area AA2 may not overlap the scan driving circuit SDC.

The second pixel driving circuit PD2 included in each of the second pixels PX2 may be disposed in the second active area AA2, and a first second-light emitting element ED1-2 and a first second-pixel driving circuit PD1-2 included in each of the first second-pixels PX1-2 may be disposed in the second active area AA2.

Accordingly, in each of the second pixels PX2, the second light emitting element ED2 may be disposed in the first active area AA1, and the second pixel driving circuit PD2 connected to the second light emitting element ED2 may be disposed in the second active area AA2.

The third active area AA3 may be defined as a portion of the active area AA, which does not overlap the scan driving circuit SDC among the active area AA. A first first-light emitting element ED1-1 and a first first-pixel driving circuit PD1-1, which are included in each of the first first-pixels PX1-1 may be disposed in the third active area AA3.

In an embodiment, the light emitting area of the first first-pixels PX1-1 may have a size smaller than that of the light emitting area of the first second-pixels PX1-2 having the same color as the first first-pixels PX1-1. In addition, the light emitting area of the first second-pixels PX1-2 may have substantially the same size as that of the light emitting area of the second pixels PX2 having the same color as the first second-pixels PX1-2. For example, the first first-pixels PX1-1 may include a first first-light emitting area PXA1-R for emitting a first color light (e.g., red light), a first second-light emitting area PXA1-G for emitting a second color light (e.g., green light), and a first third-light emitting area PXA1-B for emitting a third color light (e.g., blue light). For example, the second pixels PX2 may include a second first-light emitting area PXA2-R for emitting the first color light, a second second-light emitting area PXA2-G for emitting the second color light, and a second third-light emitting area PXA2-B for emitting the third color light. For example, the second first-light emitting area PXA2-R may have a size greater than a size of the first first-light emitting area PXA1-R, the second second-light emitting area PXA2-G may have a size greater than a size of the first second-light emitting area PXA1-G, and the second third-light emitting area PXA2-B may have a size greater than a size of the first third-light emitting area PXA1-B.

However, embodiments are not limited thereto or thereby, and the light emitting area of the first second-pixels PX1-2 may have substantially the same size as that of the light emitting area of the first first-pixels PX1-1.

Hereinafter, the light emitting area of the pixels PX described in an embodiment may be defined by an opening defined through the pixel definition layer included in the display element layer DP-OLED. In addition, the light emitting area may correspond to an area of the anode electrode exposed through the opening of the pixel definition layer.

In an embodiment, the number of the second pixels PX2 may be smaller than the number of the first first-pixels PX1-1 with respect to the same area in the active area AA. Accordingly, a density of the first first-pixels PX1-1 per unit area may be greater than a density of the second pixels PX2 per unit area.

According to an embodiment, although the second light emitting element ED2 of the second pixels PX2 is disposed in the area overlapping the scan driving circuit SDC, a total size of the active area AA may increase since the second pixel driving circuit PD2 is disposed spaced apart from the scan driving circuit SDC. Accordingly, the peripheral area NAA of the display device ELD may be reduced.

Referring to FIGS. 5A and 5B, a display panel DP may include an active area AA in which pixels PX1 and PX2 are disposed and a peripheral area NAA around the active area AA.

First pixels PX1 may include first first-pixels PX1-1 and first second-pixels PX1-2 depending on an arrangement of the active area AA. In FIGS. 5A and 5B, the same descriptions as those of FIGS. 4A and 4B will be omitted for descriptive convenience.

Only a second light emitting element ED2 may be disposed in a first active area AA1 among the second light emitting element ED2 and a second pixel driving circuit PD2, which are included in each of the second pixels PX2. The second pixel driving circuit PD2 included in the second pixels PX2 may be formed in the circuit element layer DP-CL together with a scan driving circuit SDC, and thus, the second pixel driving circuit PD2 and the second light emitting element ED2 connected to the second pixel driving circuit PD2 may be disposed in different active areas from each other.

A second active area AA2 may be disposed between a third active area AA3 and the first active area AA1. The second active area AA2 may not overlap the scan driving circuit SDC.

The second pixel driving circuit PD2 included in each of the second pixels PX2 may be disposed in the second active area AA2, and a first second-light emitting element ED1-2 and a first second-pixel driving circuit PD1-2, which are included in each of the first second-pixels PX1-2, may be disposed in the second active area AA2.

Accordingly, in each of the second pixels PX2, the second light emitting element ED2 may be disposed in the first active area AA1, and the second pixel driving circuit PD2 connected to the second light emitting element ED2 may be disposed in the second active area AA2.

The third active area AA3 may be defined as a portion of the active area AA that does not overlap the scan driving circuit SDC. A first first-light emitting element ED1-1 and a first first-pixel driving circuit PD1-1, which are included in each of the first first-pixels PX1-1, may be disposed in the third active area AA3.

In an embodiment, the light emitting area of the first first-pixels PX1-1 may have substantially the same size as the light emitting area of the first second-pixels PX1-2 having the same color as the first first-pixels PX1-1. In addition, the light emitting area of the first second-pixels PX1-2 may have substantially the same size as the light emitting area of the second pixels PX2 having the same color as the first second-pixels PX1-2.

According to an embodiment, as the light emitting area of the second pixels PX2 that overlap the scan driving circuit SDC has substantially the same size as that of the light emitting area of the first pixels PX1 that do not overlap the scan driving circuit SDC, a display quality of the display device ELD may be improved.

Figure 6A:
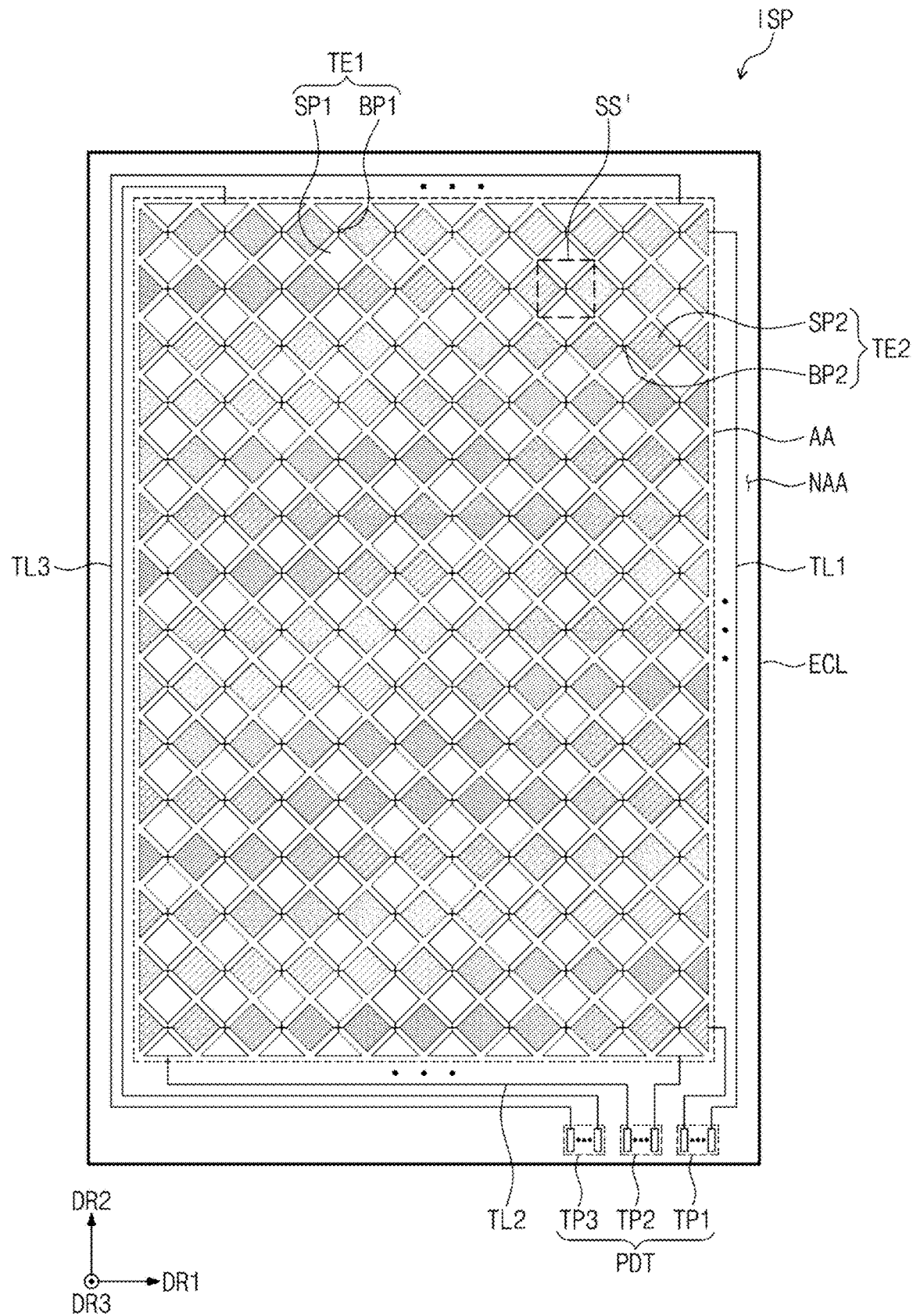
FIG. 6A is a plan view of a sensing sensor of the display device of FIG. 1B.
Figure 6B:
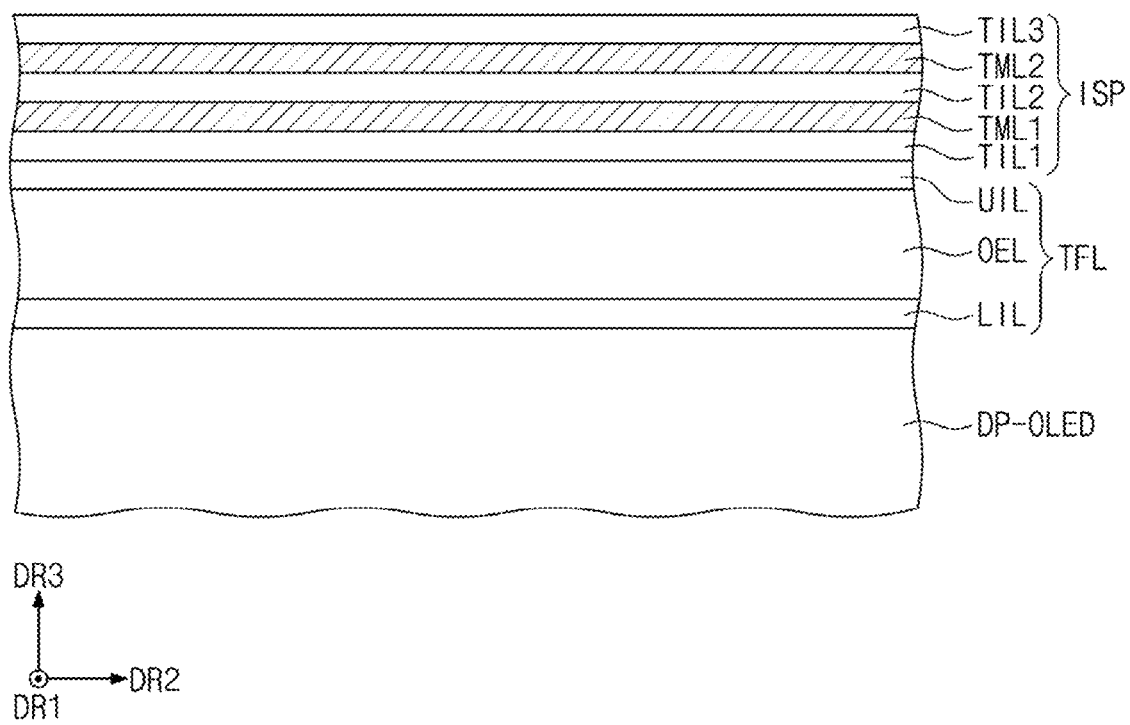
FIG. 6B is a cross-sectional view of a display module including the display panel and the sensing sensor of the display device of FIG. 1B.
Figure 7:
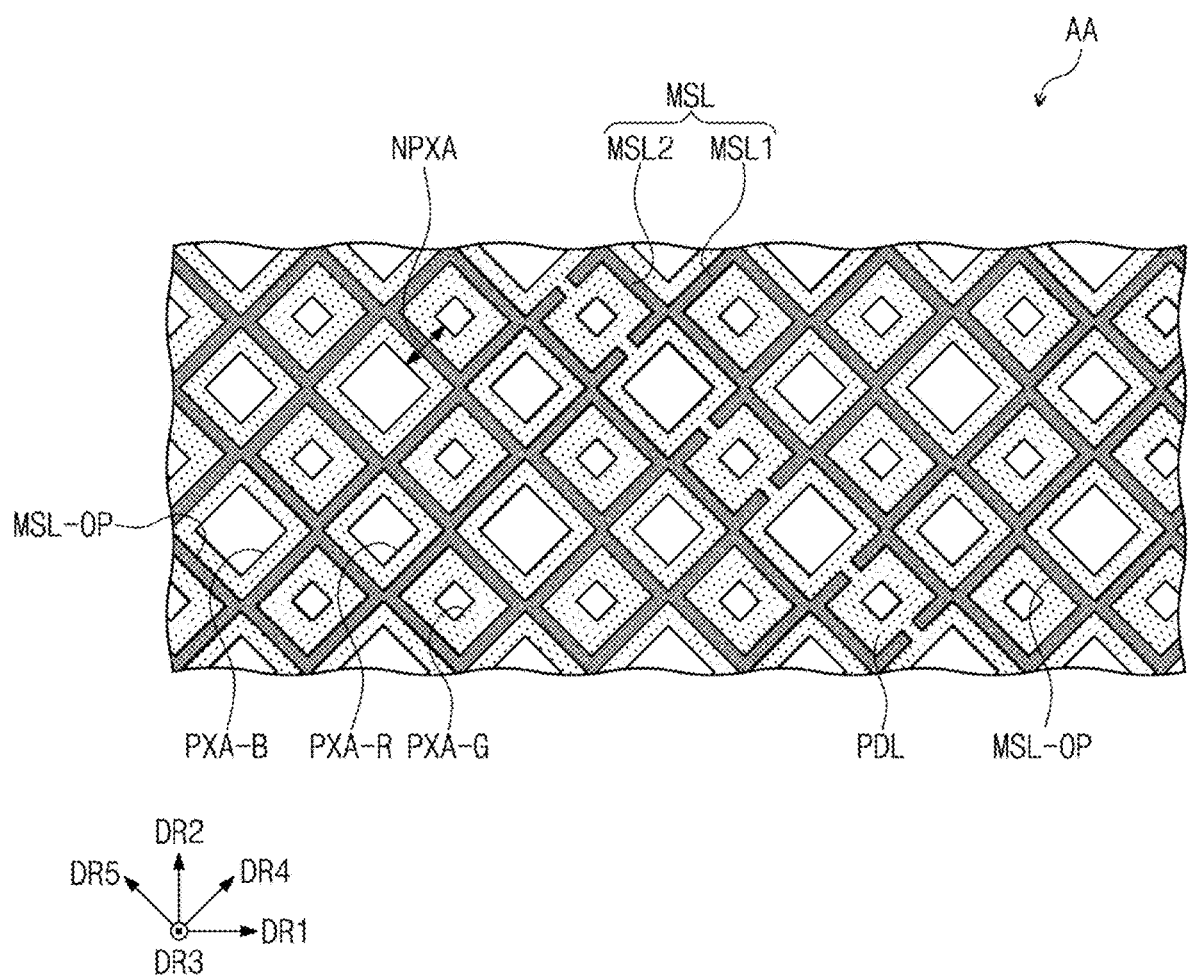
FIG. 7 is a plan view illustrating a relation between light emitting areas of the display panel and the sensing sensor of the display device of FIG. 1B.
Figure 8:
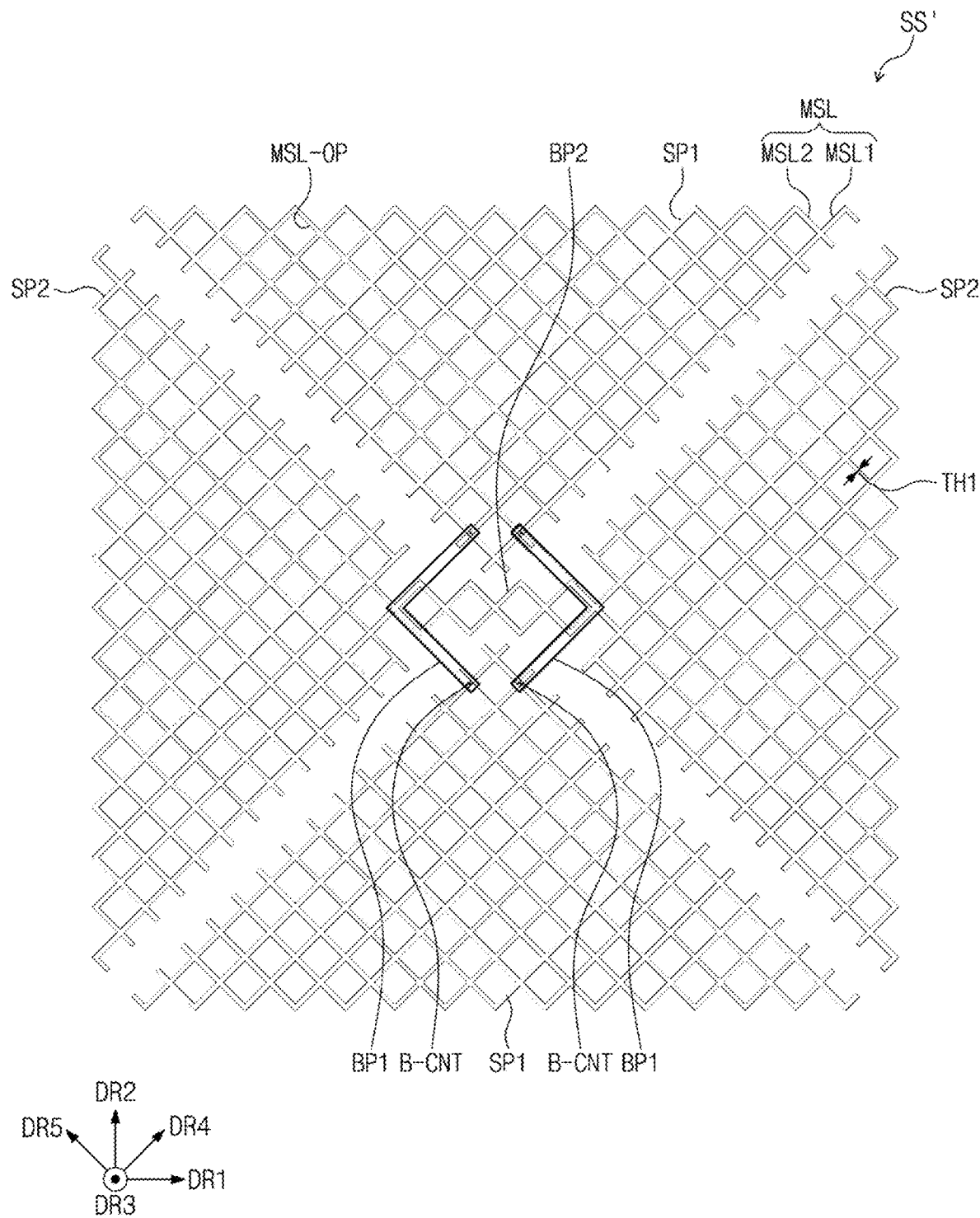
FIG. 8 is an enlarged plan view of an area SS' of FIG. 6A.

FIG. 6A is a plan view of the sensing sensor ISP according to an embodiment. FIG. 6B is a cross-sectional view of components of the display panel DP and the sensing sensor ISP according to an embodiment. FIG. 7 is a plan view showing a relation between the light emitting areas and the sensing sensor ISP according to an embodiment. FIG. 8 is an enlarged plan view of an area SS' of FIG. 6A.

Referring to FIGS. 6A and 6B, the sensing sensor ISP may be disposed directly on the upper insulating layer TFL. The sensing sensor ISP may be disposed directly on the upper insulating layer TFL and may be formed with the upper insulating layer TFL through successive processes. The sensing sensor ISP may sense an external input using a self-capacitance method or a mutual capacitance method. The sensing patterns included in the sensing sensor ISP may be arranged and connected in various ways according to the sensing methods.

The upper insulating layer TFL may include an organic layer OEL and a plurality of inorganic layers LIL and UIL encapsulating the organic layer OEL. The upper insulating layer TFL may encapsulate the display element layer DP-OLED to prevent moisture and oxygen from entering the display element layer DP-OLED.

The inorganic layers LIL and UIL may prevent external moisture and oxygen from entering the display element layer DP-OLED. The inorganic layers LIL and UIL may include silicon nitride, silicon oxide, or compounds thereof. The inorganic layers may be formed through a deposition process.

The organic layer OEL may be disposed above the display element layer DP-OLED and may provide a flat surface. Uneven portions or particles on an upper surface of the display element layer DP-OLED may be covered by the organic layer OEL, and thus, influences on components formed on the organic layer OEL, e.g., the sensing sensor ISP, may be prevented.

The sensing sensor ISP may include sensing insulating layers TIL1 TIL2, and TIL3, e.g., first, second, and third sensing insulating layers TIL1 TIL2, and TIL3, and at least one or more conductive layers TML1 and TML2, e.g., first and second conductive layers TML1 and TML2. The sensing insulating layers TIL1 TIL2, and TIL3 may include one of an inorganic material and an organic material.

The first sensing insulating layer TIL1 may be disposed on a second inorganic layer UIL of the upper insulating layer TFL. The first conductive layer TML1 may be disposed on the first sensing insulating layer TIL1. The second sensing insulating layer TIL2 may be disposed above the first sensing insulating layer TIL1 and may cover the first conductive layer TML1. The second conductive layer TML2 may be disposed on the second sensing insulating layer TIL2. The third sensing insulating layer TIL3 may be disposed above the second sensing insulating layer TIL2 and may cover the second conductive layer TML2.

However, embodiments are not limited thereto or thereby. According to an embodiment, the first sensing insulating layer TIL1 may be omitted, the first conductive layer TML1 may be disposed directly on the second inorganic layer UIL, and embodiments are not limited thereto.

The sensing sensor ISP may include a plurality of sensing electrodes TE1 and TE2, a plurality of sensing lines TL1, TL2, and TL3, and a plurality of sensing pads PDT.

The sensing sensor ISP may include an active area AA (e.g., a display area) and a peripheral area NAA (e.g., a non-display area) defined adjacent to the active area AA. The active area AA and the peripheral area NAA of the sensing sensor ISP may correspond to the active area AA and the peripheral area NAA of the display panel DP, respectively.

The sensing electrodes TE1 and TE2 may include a first sensing electrode TE1 and a second sensing electrode TE2.

The first sensing electrode TE1 may extend in the second direction DR2 and may be provided in plural, and the first sensing electrodes TE1 may be arranged in the first direction DR1. The first sensing electrode TE1 may include first sensing patterns SP1 and first bridge patterns BP1. The first sensing patterns SP1 may be arranged in the second direction DR2. At least one first bridge pattern BP1 may be connected to two first sensing patterns SP1 adjacent to each other.

The second sensing electrode TE2 may extend in the first direction DR1 and may be provided in plural, and the second sensing electrodes TE2 may be arranged in the second direction DR2. The second sensing electrode TE2 may include second sensing patterns SP2 and second bridge patterns BP2. The second sensing patterns SP2 may be arranged in the first direction DR1. At least one second bridge pattern BP2 may be connected to two second sensing patterns SP2 adjacent to each other.

The sensing lines TL1, TL2, and TL3 may include a first sensing line TL1, a second sensing line TL2, and a third sensing line TL3.

The first sensing line TL1 may be connected to the second sensing electrode TE2. The second sensing line TL2 may be connected to one end of the first sensing electrode TE1. The third sensing line TL3 may be connected to the other end of the first sensing electrode TE1. The other end of the first sensing electrode TE1 may be a portion opposite to the one end of the first sensing electrode TE1.

According to an embodiment, the first sensing electrode TE1 may be connected to the second sensing line TL2 and the third sensing line TL3. Accordingly, sensitivity with respect to the first sensing electrode TE1, which has a relatively long length compared with the second sensing electrode TE2, may be uniformly maintained regardless of regions.

The sensing pads PDT may be disposed in the peripheral area NAA. The sensing pads PDT may include a first sensing pad TP1, a second sensing pad TP2, and a third sensing pad TP3. The first sensing pad TP1 may be connected to the first sensing line TL1 and may be electrically connected to the second sensing electrode TE2. The second sensing pad TP2 may be connected to the second sensing line TL2. The third sensing pad TP3 may be connected to the third sensing line TL3. Accordingly, the second sensing pad TP2 and the third sensing pad TP3 may be electrically connected to the first sensing electrode TEL However, embodiments are not limited thereto or thereby. According to an embodiment, the sensing pads PDT of the sensing sensor ISP may be disposed on the same layer as display pads of the display panel DP through contact holes defined through the sensing insulating layers. However, embodiments are not limited thereto.

The first conductive layer TML1 may include portions of the sensing lines TL1, TL2, and TL3 and the first bridge patterns BP1. The second conductive layer TML2 may include the other portions of the sensing lines TL1, TL2, and TL3, the first sensing patterns SP1, the second sensing patterns SP2, and the second bridge patterns BP2.

FIG. 7 shows a relation between the sensing electrodes TE1 and TE2 included in the sensing sensor ISP and light emitting areas PXA-R, PXA-G, and PXA-B included in the active area AA.

The sensing sensor ISP may include a plurality of mesh lines MSL10 and MSL2 extending in a fourth direction DR4 and a fifth direction DR5. The mesh lines MSL1 and MSL2 may not overlap the light emitting areas PXA-R, PXA-G, and PXA-B and may overlap a non-light-emitting area NPXA. Accordingly, the openings OP defined through the pixel definition layer PDL included in the display element layer DP-OLED (refer to FIG. 2C) may overlap corresponding mesh openings MSL-OP.

The mesh lines MSL1 and MSL2 may define the mesh openings MSL-OP. The mesh lines may have a line width of a few nanometers to a few micrometers. The mesh openings MSL-OP may correspond to the light emitting areas PXA-R, PXA-G, and PXA-B in a one-to-one correspondence. FIG. 7 shows the light emitting areas PXA-R, PXA-G, and PXA-B classified into three groups according to the colors of light emitted therefrom.

The light emitting areas PXA-R, PXA-G, and PXA-B may have different sizes according to the colors of the lights emitted from the light emitting elements LD thereof. The sizes of the light emitting areas PXA-R, PXA-G, and PXA-B may be determined according to the color of the light emitted from the light emitting element LD. For example, the light emitting areas PXA-R, PXA-G, and PXA-B may include a first light emitting area PXA-R for emitting a first color light (e.g., red light), a second light emitting area PXA-G for emitting a second color light (e.g., green light), and a third light emitting area PXA-B for emitting a third color light (e.g., blue light).

The light emitting areas PXA-R, PXA-G, and PXA-B having various sizes are shown, however, embodiments are not limited thereto or thereby. The light emitting areas PXA-R, PXA-G, and PXA-B may have the same size as each other.

According to an embodiment, as the mesh lines MSL1 and MSL2 of the sensing electrodes TE1 and TE2 are disposed not to overlap the light emitting areas PXA-R, PXA-G, and PXA-B, the light provided from the pixel PX may not be influenced or interrupted by the mesh lines MSL1 and MSL2. Accordingly, a color purity of the display device ELD may be improved.

FIG. 8 is an enlarged view showing a portion of each of the first sensing patterns SP1, the first bridge pattern BP1, the second sensing patterns SP2, and the second bridge pattern BP2, which form one node, of the sensing electrodes TE1 and TE2.

The second sensing insulating layer TIL2 may be provided with a plurality of contact holes B-CNT. The contact holes B-CNT may overlap the portion of the first sensing patterns SP1 and the first bridge pattern BP1.

The first bridge pattern BP1 may be disposed on the first sensing insulating layer TIL1. The portion of the first sensing patterns SP1 may be connected to the first bridge pattern BP1 via the contact holes B-CNT defined through the second sensing insulating layer TIL2. The contact holes B-CNT may overlap the mesh lines MSL.

Figure 9:
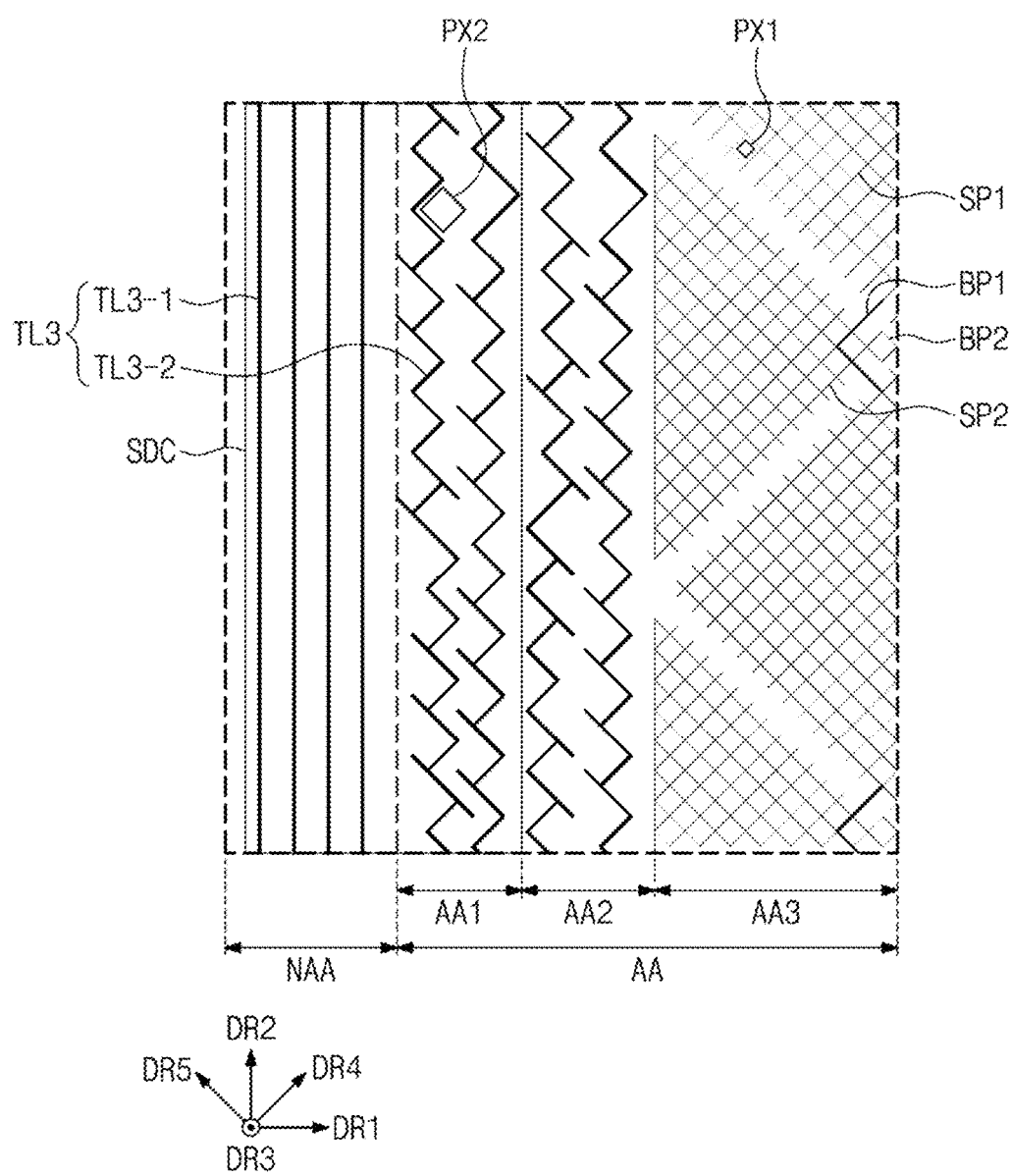
FIG. 9 is an enlarged plan view of an area of an embodiment of the sensing sensor of the display device of FIG. 1B.
Figure 10:
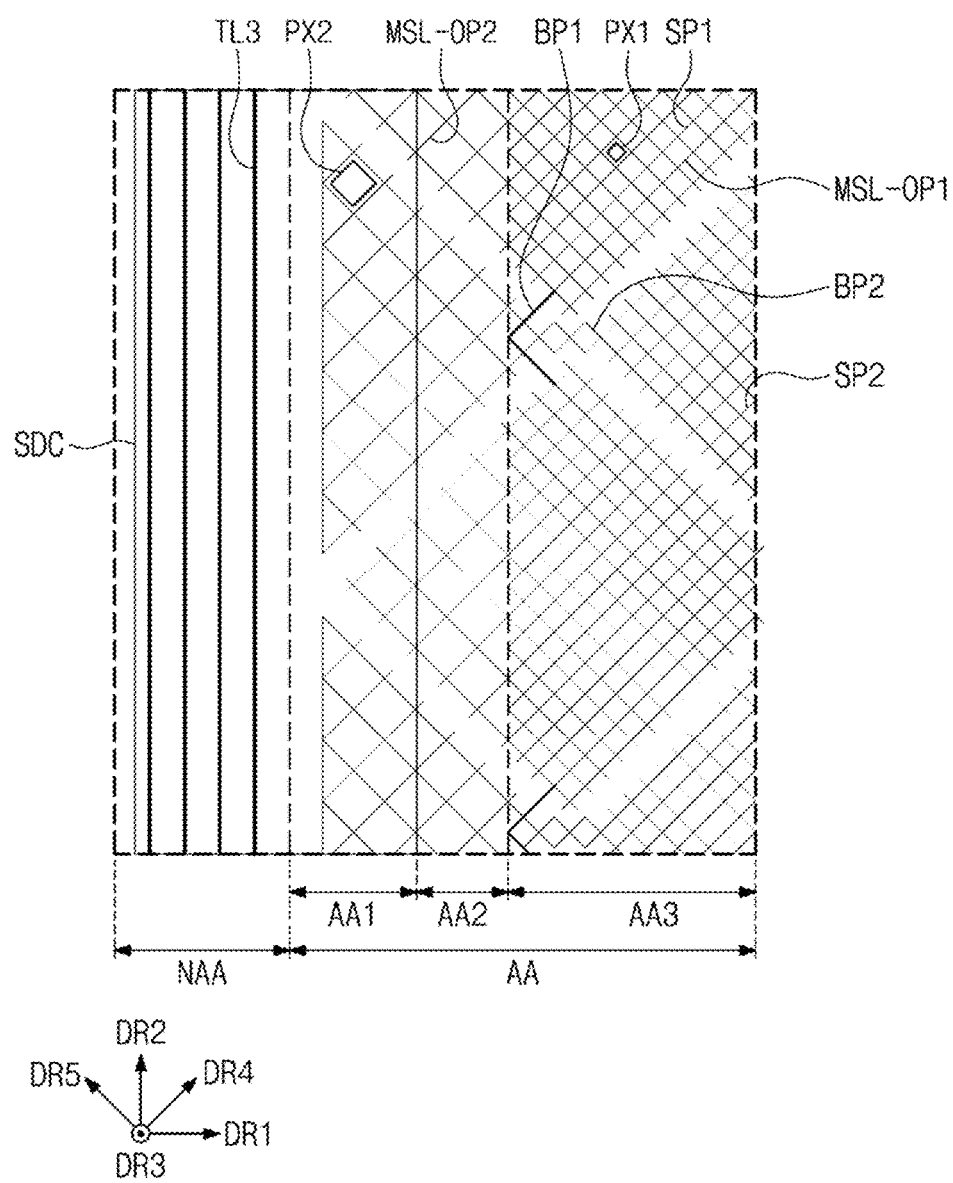
FIG. 10 is an enlarged plan view of an area of another embodiment of the sensing sensor of the display device of FIG. 1B.
Figure 11:
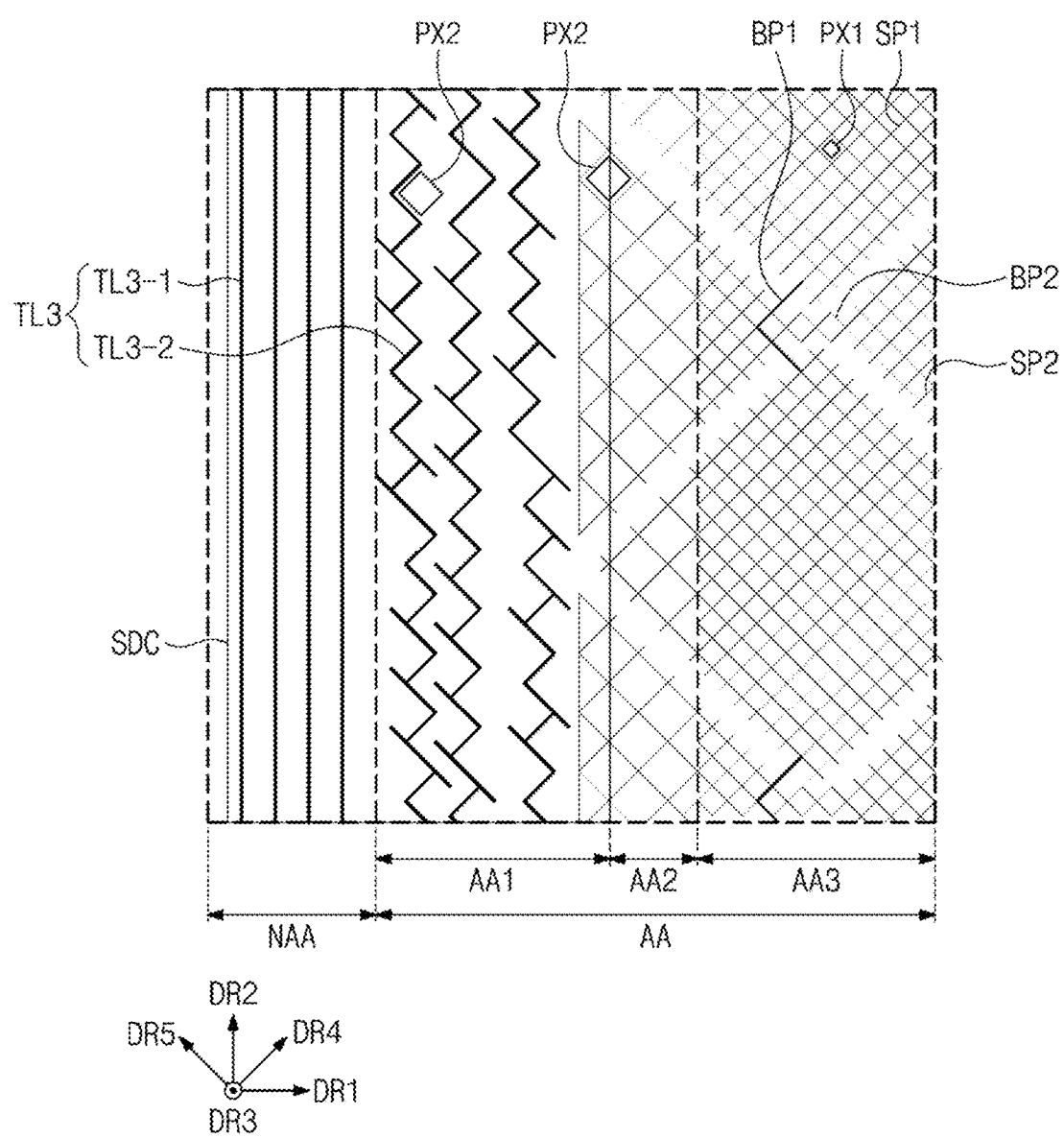
FIG. 11 is an enlarged plan view of an area of another embodiment of the sensing sensor of the display device of FIG. 1B.

FIG. 9 is an enlarged plan view showing an area of a sensing sensor ISP according to an embodiment. FIG. 10 is an enlarged plan view showing an area of a sensing sensor ISP according to an embodiment of the present disclosure. FIG. 11 is an enlarged plan view showing an area of a sensing sensor ISP according to an embodiment.

FIGS. 9, 10, and 11 are plan views showing the areas overlapping the scan driving circuit SDC among components included in the sensing sensor ISP.

Referring to FIG. 9, the sensing sensor ISP may include an active area AA (e.g., a display area) and a peripheral area NAA (e.g., a non-display area). The active area AA may include a first active area AA1 (e.g., a first display area), a second active area AA2 (e.g., a second display area), and a third active area AA3 (e.g., a third display area), which are sequentially arranged. For example, the third active area AA3 may be a touch sensing area.

The first, second, and third active areas AA1, AA2, and AA3 of the sensing sensor ISP may correspond to the first, second, and third active areas AA1, AA2, and AA3 of the display panel DP described with reference to FIG. 4A, respectively.

Mesh lines included in sensing patterns SP1 and SP2 and second bridge patterns BP2 may not overlap a light emitting area of a first pixel PX1. The first pixel PX1 may correspond to one of the first pixels PX1 described with reference to FIGS. 4A and 5A.

A third sensing line TL3 connected to the first electrode TE1 (refer to FIG. 6A) may include a first trace line TL3-1 and a second trace line TL3-2 adjacent to each other. The first trace line TL3-1 may be disposed in the peripheral area NAA and may overlap the scan driving circuit SDC. The second trace line TL3-2 may be disposed in the active area AA and may overlap the scan driving circuit SDC.

According to an embodiment, the second trace line TL3-2 may include mesh lines extending in the fourth direction DR4 and the fifth direction DR5, and the mesh lines may be alternately arranged with each other while extending in the second direction DR2. For example, the first trace line TL3-1 may extend in a straight-line shape along the second direction DR2, and the second trace line TL3-2 may extend in a zigzag shape along the second direction DR2. The second trace line TL3-2 may not overlap the light emitting area of a second pixel PX2. The second pixel PX2 may correspond to one of the second pixels PX2 described with reference to FIGS. 4A and 5A.

In a case where the second trace line TL3-2 has a straight-line shape in one direction as the first trace line TL3-1, the second trace line TL3-2 overlaps the second pixels PX2 since the second trace line TL3-2 is disposed in the active area AA. As a result, interference occurs between a light provided with the second pixels PX2 and the second trace line TL3-2.

According to an embodiment, the second trace line TL3-2 may include the mesh lines having substantially the same shape as that of the mesh lines included in the sensing patterns SP1 and SP2 and may be disposed not to overlap the light emitting area of the second pixels PX2 overlapping the scan driving circuit SDC. Accordingly, even though the second trace line TL3-2 is disposed in the active area AA, the second trace line TL3-2 may not exert influence on the light provided from the second pixel PX2. Accordingly, the color purity of the display device ELD may be improved.

Referring to FIG. 10, the sensing sensor ISP may include an active area AA (e.g., a display area) and a peripheral area NAA (e.g., a non-display area). The active area AA may include a first active area AA1 (e.g., a first display area), a second active area AA2 (e.g., a second display area), and a third active area AA3 (e.g., a third display area), which are sequentially arranged. For example, the first active area AA1, the second active area AA2, and the third active area AA3 may be touch sensing areas. In FIG. 10, the same descriptions as those in FIG. 9 will be omitted for descriptive convenience.

According to an embodiment, portions of sensing patterns SP1 and SP2 may overlap the scan driving circuit SDC in the active area AA.

Among first and second pixels PX1 and PX2, a light emitting area of the second pixel PX2 that overlaps the scan driving circuit SDC may be greater than a light emitting area of the first pixel PX1 that does not overlap the scan driving circuit SDC. Accordingly, in a case where the sensing patterns SP1 and SP2 include the same mesh openings, interference may occur between the second pixel PX2 and the sensing patterns SP1 and SP2 in the area in which the second pixel PX2 is disposed.

According to an embodiment, mesh lines of the sensing patterns SP1 and SP2 may be provided with mesh openings having different sizes depending on whether the mesh lines overlap the scan driving circuit SDC.

As an example, among the mesh lines included in the sensing patterns SP1 and SP2, mesh lines that do not overlap the scan driving circuit SDC may be provided with a first mesh opening MSL-OP1 defined therethrough and having a first size. The first mesh opening MSL-OP1 may surround the light emitting area of the first pixel PX1.

Among the mesh lines included in the sensing patterns SP1 and SP2, mesh lines that overlap the scan driving circuit SDC may be provided with a second mesh opening MSL-OP2 defined therethrough and having a second size, and the second size may be greater than the first size of the mesh opening MSL-OP1. The second mesh opening MSL-OP2 may surround the light emitting area of the second pixel PX2.

According to an embodiment, although portions of the sensing patterns SP1 and SP2 are disposed on the light emitting area of the second pixel PX2 that overlaps the scan driving circuit SDC, the portions of the sensing patterns SP1 and SP2 may not exert influences on a light provided from the second pixel PX2. Accordingly, the color purity of the display device ELD may be improved.

Referring to FIG. 11, the sensing sensor ISP may include an active area AA (e.g., a display area) and a peripheral area NAA (e.g., a non-display area). The active area AA may include a first active area AA1 (e.g., a first display area), a second active area AA2 (e.g., a second display area), and a third active area AA3 (e.g., a third display area), which are sequentially arranged. For example, the second active area AA2 and the third active area AA3 may be touch sensing areas. In FIG. 11, the same descriptions as those in FIGS. 9 and 10 will be omitted for descriptive convenience.

According to an embodiment, a third sensing line TL3 connected to a first electrode TE1 (refer to FIG. 6A) may include a first trace line TL3-1 and a second trace line TL3-2. The first trace line TL3-1 may be disposed in the peripheral area NAA and may overlap the scan driving circuit SDC. The second trace line TL3-2 may be disposed in the active area AA and may overlap the scan driving circuit SDC.

The second trace line TL3-2 may include mesh lines extending in the fourth direction DR4 and the fifth direction DR5, and the mesh lines extending in different directions from each other may be alternately arranged with each other while extending in the second direction DR2. The second trace line TL3-2 may not overlap a light emitting area of a second pixel PX2.

According to an embodiment, portions of sensing patterns SP1 and SP2 may overlap the scan driving circuit SDC in the active area AA.

Among the mesh lines included in the sensing patterns SP1 and SP2, mesh lines that overlap the scan driving circuit SDC may be provided with a first mesh opening defined therethrough to surround a light emitting area of a first pixel PX1, and mesh lines that overlap the scan driving circuit SDC among the mesh lines included in the sensing patterns SP1 and SP2 may be provided with a second mesh opening defined therethrough to surround the light emitting area of the second pixel PX2.

According to an embodiment, even though the second trace line TL3-2 and the portions of the sensing patterns SP1 and SP2 are disposed on the light emitting area of the second pixel PX2 overlapping the scan driving circuit SDC, the second trace line TL3-2 and the portions of the sensing patterns SP1 and SP2 may not exert influences on the light provided from the second pixel PX2. Accordingly, the color purity of the display device ELD may be improved.

Figure 12:
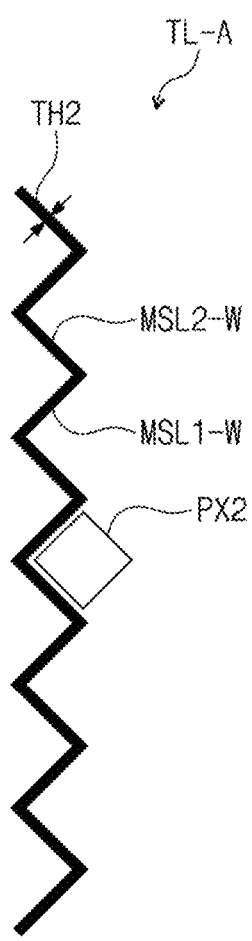
FIG. 12 is a plan view of a shape of an embodiment of a sensing line of the sensing sensor of the display device of FIG. 1B.
Figure 13:
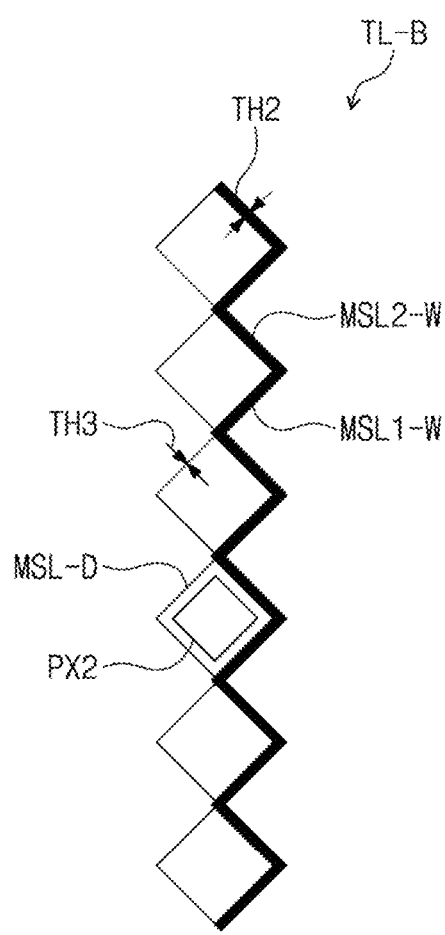
FIG. 13 is a plan view of a shape of another embodiment of the sensing line of the sensing sensor of the display device of FIG. 1B.

FIG. 12 is a plan view showing a shape of a sensing line according to an embodiment, and FIG. 13 is a plan view showing a shape of a sensing line according to an embodiment.

FIGS. 12 and 13 shows embodiments of a second trace line TL3-2 (hereinafter, referred to as a sensing line) disposed in the active area AA and overlapping the scan driving circuit SDC among the third sensing lines TL3 of FIG. 9.

Referring to FIG. 12, a sensing line TL-A may include mesh lines MSL1-W and MSL2-W extending in the fourth direction DR4 and the fifth direction DR5. The mesh lines MSL1-W and MSL2-W may be alternately arranged with each other while extending in the second direction DR2.

The mesh lines MSL1-W and MSL2-W may surround one side of a light emitting area of a second pixel PX2, and the other side opposite to the one side of the light emitting area may be exposed without being covered by the mesh lines MSL1-W and MSL2-W.

According to an embodiment, the mesh lines MSL1-W and MSL2-W may have a second width TH2. Referring to FIG. 8, the mesh lines MSL1 and MSL2 included in the sensing patterns SP1 and SP2 may have a first width TH1. The second width TH2 may be greater than the first width TH1.

According to an embodiment, as the sensing line TL-A overlapping the scan driving circuit SDC has a width greater than that of the sensing patterns SP1 and SP2 disposed in the active area, a resistance of the sensing line TL-A may be reduced.

Referring to FIG. 13, a sensing line TL-B may include mesh lines MSL1-W and MSL2-W extending in the fourth direction DR4 and the fifth direction DR5. The mesh lines MSL1-W and MSL2-W may be alternately arranged with each other while extending in the second direction DR2.

The mesh lines MSL1-W and MSL2-W may surround one side of a light emitting area of a second pixel PX2.

According to an embodiment, the mesh lines MSL1-W and MSL2-W may have a second width TH2. Referring to FIG. 8, the mesh lines MSL1 and MSL2 included in the sensing patterns SP1 and SP2 may have a first width TH1. In the present embodiment, the second width TH2 may be greater than the first width TH1.

According to an embodiment, the sensing line TL-B may further include additional mesh lines MSL-D that surround the other side exposed without being covered by the mesh lines MSL1-W and MSL2-W. The additional mesh lines MSL-D may extend in the fourth direction DR4 and the fifth direction DR5 and may define mesh openings with the mesh lines MSL1-W and MSL2-W to surround the other side of the light emitting area of the second pixel PX2.

The additional mesh lines MSL-D may have a third width TH3. The third width TH3 may be smaller than the second width TH2 and may be equal to or greater than the first width TH1.

According to an embodiment, as the sensing line TL-B includes the additional mesh lines MSL-D having the width similar to the width of the mesh lines included in the sensing patterns SP1 and SP2, defects in which the mesh lines MSL1-W and MSL2-W having the relatively large width are viewed to the user may be prevented.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
a display panel divided into a peripheral area and an active area comprising first to third areas sequentially arranged in a direction away from the peripheral area, and including pixels, each including a pixel circuit and a light emitting element connected to the pixel circuit, disposed in the active area, and a scan driving circuit configured to drive the pixels; and
a sensing sensor disposed on the display panel and comprising sensing patterns overlapping the active area and sensing lines connected to the sensing patterns;
wherein the pixel circuits overlap the second area and the third area, the scan driving circuit overlaps the peripheral area and the first area, and
wherein the pixels comprise:
first pixels that do not overlap the scan driving circuit; and
second pixels that overlap the scan driving circuit,
wherein the light emitting element of the second pixel is disposed in the first area, and the pixel circuit connected to the light emitting element of the second pixel is disposed in the second area, and
wherein a size of the sensing patterns overlapping the second area is different from a size of the sensing patterns overlapping the third area.

2. The display device of claim 1, wherein the sensing patterns comprise mesh lines, and the mesh lines define openings that do not overlap light emitting areas through which light is provided from the pixels.

3. The display device of claim 2, wherein sizes of first openings defined on the mesh lines overlapping the second area are greater than sizes of second openings defined on the mesh lines overlapping the third area.

4. The display device of claim 1, wherein at least one of the sensing lines overlaps the scan driving circuit.

5. The display device of claim 1, wherein, some of the sensing lines overlap the first area and the second area, and others of the sensing lines overlap the peripheral area.

6. The display device of claim 5, wherein, areas to which light is provided from the pixels are defined as light emitting areas,
wherein the some of the sensing lines comprise mesh lines that do not overlap with the light emitting areas.

7. The display device of claim 5, wherein the others of the sensing lines have a line shape extending along the peripheral area.

8. The display device of claim 1, wherein, some of the sensing patterns overlap the first area, and the some of the sensing patterns overlap the scan driving circuit.

9. The display device of claim 2, wherein:
the light emitting area of the first pixels comprise a first first-light emitting area configured to emit a first color light, a first second-light emitting area configured to emit a second color light, and a first third-light emitting area configured to emit a third color light, and
the light emitting area of the second pixels comprise a second first-light emitting area configured to emit the first color light, a second second-light emitting area configured to emit the second color light, and a second third-light emitting area configured to emit the third color light.

10. The display device of claim 9, wherein:
the second first-light emitting area has a size greater than a size of the first first-light emitting area,
the second second-light emitting area has a size greater than a size of the first second-light emitting area, and
the second third-light emitting area has a size greater than a size of the first third-light emitting area.

11. The display device of claim 1, wherein the display panel further comprises an encapsulation layer covering the pixels, and the sensing sensor further comprises at least one detection insulating layer disposed directly on the encapsulation layer and having the sensing patterns disposed thereon.

12. The display device of claim 1, wherein a size of the sensing patterns overlapping the first area is the same as a size of the sensing patterns overlapping the second area.

13. The display device of claim 1, wherein the sensing patterns comprise first and second mesh lines that extend in opposite directions with respect to each other, and the first and second mesh lines define openings that do not overlap light emitting areas through which light is provided from the pixels, and
wherein sizes of first openings defined on mesh lines overlapping the first area are the same as sizes of second openings defined on mesh lines overlapping the second area.

* * * * *